US008813010B2

(12) United States Patent
Oda

(10) Patent No.: US 8,813,010 B2
(45) Date of Patent: Aug. 19, 2014

(54) TIMING ANALYSIS PROGRAM, TIMING ANALYSIS APPARATUS, AND TIMING ANALYSIS METHOD

(71) Applicant: Renesas Electronics Corporation, Kawasaki (JP)

(72) Inventor: Yasuhiro Oda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/845,470

(22) Filed: Mar. 18, 2013

(65) Prior Publication Data

US 2013/0275932 A1     Oct. 17, 2013

(30) Foreign Application Priority Data

Apr. 13, 2012 (JP) .................................. 2012-091808

(51) Int. Cl.
*G06F 9/455* (2006.01)
*G06F 17/50* (2006.01)

(52) U.S. Cl.
USPC ............ 716/108; 716/106; 716/113; 716/134

(58) Field of Classification Search
CPC ............ G06F 17/5031; G06F 17/5036; G06F 17/5068; G06F 17/5081
USPC .................................. 716/106, 108, 113, 134
See application file for complete search history.

(56) References Cited

U.S. PATENT DOCUMENTS

| | | | | |
|---|---|---|---|---|
| 6,425,115 | B1 * | 7/2002 | Risler et al. | 716/114 |
| 7,299,438 | B2 * | 11/2007 | Hosono | 716/113 |
| 7,835,888 | B2 * | 11/2010 | Inoue et al. | 702/194 |
| 2006/0109032 | A1 * | 5/2006 | Hosono | 327/41 |
| 2008/0052653 | A1 * | 2/2008 | Tuncer et al. | 716/6 |
| 2008/0104562 | A1 * | 5/2008 | Ichinose | 716/6 |
| 2010/0242007 | A1 * | 9/2010 | Yoda | 716/6 |
| 2011/0082657 | A1 * | 4/2011 | Ito | 702/79 |

FOREIGN PATENT DOCUMENTS

JP     2007-133497 A     5/2007

* cited by examiner

*Primary Examiner* — Vuthe Siek
*Assistant Examiner* — Brian Ngo
(74) *Attorney, Agent, or Firm* — McGinn IP Law Group, PLLC

(57) ABSTRACT

A timing analysis program for performing analysis condition generation processing which generates a first analysis condition in which the variation width of a first delay value of a first circuit cell is shifted on the basis of a first variation coefficient and a second analysis condition in which the variation width of a second delay value of a second circuit cell is shifted on the basis of a second variation coefficient.

20 Claims, 18 Drawing Sheets

FIG. 2

```
MIDDLE THRESHOLD CELL OCV TABLE

MAX-Hold-Late
Cell MVT*
Stage    0     1     2     3     4     5     7     8     9    10    15    20    30    50
Distance 0   500  1000  1500  2000  3000  4000  5000  6000  8000 10000 15000
1.048 1.048 1.015 1.015 1.000 1.000 1.000 1.000 1.000 1.000 1.000 1.000 1.000 1.000
1.048 1.048 1.015 1.015 1.000 1.000 1.000 1.000 1.000 1.000 1.000 1.000 1.000 1.000
......

MAX-Hold-Early
Cell MVT*
Stage    0     1     2     3     4     5     6     7     8     9    10    15    20    30    50
Distance 0   500  1000  1500  2000  3000  4000  5000  6000  8000 10000 15000
0.757 0.757 0.788 0.801 0.810 0.815 0.819 0.822 0.825 0.827 0.829 0.835 0.838 0.843 0.847
0.757 0.757 0.788 0.801 0.810 0.815 0.819 0.822 0.825 0.827 0.829 0.835 0.838 0.843 0.847
......
```

- CELL STAGE NUMBER IN PATH
- DISTANCE D BETWEEN END POINTS OF PATH
- TABLE IN THE CASE OF DISTANCE D=0
- TABLE IN THE CASE OF DISTANCE D=500

FIG. 3

VARIATION COEFFICIENT INFORMATION

| #VT, | Early_OCV derating value, Late_OCV derating value |
|---|---|
| LVT: | 0.956, 1.050 |
| MVT: | 0.946, 1.043 |
| HVT: | 0.915, 1.100 |

FIG. 4

MIDDLE THRESHOLD CELL OCV TABLE (x0.946 [MVT.Early])

```
MAX-Hold-Late
Cell MVT*
Stage  0 1 2 3 4 5 7 8 9 10 15 20 30 50
Distance 0 500 1000 1500 2000 3000 4000 5000 6000 8000 10000 15000
0.991 0.991 0.960 0.946 0.946 0.946 0.946 0.946 0.946 0.946 0.946 0.946
0.991 0.991 0.960 0.946 0.946 0.946 0.946 0.946 0.946 0.946 0.946 0.946
 ........      ........

MAX-Hold-Early
Cell MVT*
Stage  0 1 2 3 4 5 6 7 8 9 10 15 20 30 50
Distance 0 500 1000 1500 2000 3000 4000 5000 6000 8000 10000 15000
0.716 0.716 0.745 0.758 0.766 0.771 0.775 0.778 0.780 0.782 0.784 0.790 0.793 0.797 0.801
0.716 0.716 0.745 0.758 0.766 0.771 0.775 0.778 0.780 0.782 0.784 0.790 0.793 0.797 0.801
 ........      ........
```

FIG. 5

MIDDLE THRESHOLD CELL OCV TABLE (x1.043 [MVT.Late])

```
MAX-Hold-Late
Cell MVT*
Stage 0 1 2 3 4 5 7 8 9 10 15 20 30 50
Distance 0 500 1000 1500 2000 3000 4000 5000 6000 8000 10000 15000
1.093 1.093 1.059 1.043 1.043 1.043 1.043 1.043 1.043 1.043 1.043 1.043 1.043 1.043
1.093 1.093 1.059 1.043 1.043 1.043 1.043 1.043 1.043 1.043 1.043 1.043 1.043 1.043
........

MAX-Hold-Early
Cell MVT*
Stage 0 1 2 3 4 5 6 7 8 9 10 15 20 30 50
Distance 0 500 1000 1500 2000 3000 4000 5000 6000 8000 10000 15000
0.790 0.790 0.822 0.835 0.845 0.850 0.854 0.857 0.860 0.863 0.865 0.871 0.874 0.879 0.883
0.790 0.790 0.822 0.835 0.845 0.850 0.854 0.857 0.860 0.863 0.865 0.871 0.874 0.879 0.883
........
```

FIG. 12

| TIMING ANALYSIS NUMBER | CELL THRESHOLD VOLTAGE | | |
|---|---|---|---|
| | HVT | MVT | LVT |
| 1 | Early | Early | Early |
| 2 | Early | Early | Late |
| 3 | Early | Late | Early |
| 4 | Early | Late | Late |
| 5 | Late | Early | Early |
| 6 | Late | Early | Late |
| 7 | Late | Late | Early |
| 8 | Late | Late | Late |

VARIATION COEFFICIENT INFORMATION

```
#VT,   Early_OCV derating value, Late_OCV derating value

MVT:   0.901, 1.091

#MVT_Early = MVT_Early_original/LVT_Late_original
#MVT_Late  = MVT_Late_original/LVT_Early_original

HVT:   0.871, 1.151

#HVT_Early = HVT_Early_original/LVT_Late_original
#HVT_Late  = HVT_Late_original/LVT_Early_original
```

| TIMING ANALYSIS NUMBER | CELL THRESHOLD VOLTAGE | | |
|---|---|---|---|
| | HVT | MVT | LVT |
| 1 | Early | Early | — |
| 2 | Early | Late | — |
| 3 | Late | Early | — |
| 4 | Late | Late | — |

FIG. 21

DELAY INFORMATION INCLUDED IN CIRCUIT INFORMATION

```
(INSTANCE CELL_1)
(DELAY
 (ABSOLUTE
  (IOPATH A YB (0.050 : : 0.052) (0.050 : : 0.052))
  (IOPATH B YB (0.060 : : 0.062) (0.060 : : 0.062))
  (IOPATH C YB (0.070 : : 0.072) (0.070 : : 0.072))
 )
)
# SDF SYNTAX
#  IOPATH INPUT TERMINAL  OUTPUT TERMINAL (rise_min : rise_typ : rise_max) (fall_min : fall_typ : fall_max)
```

FIG. 22

DELAY INFORMATION FOR WHICH VARIATION COEFFICIENT OF Early CONDITION OF
MIDDLE THRESHOLD CELL MVT IS APPLIED (ANALYZED CIRCUIT INFORMATION)

```
(INSTANCE CELL_1)
 (DELAY
  (ABSOLUTE
   (IOPATH A YB (0.047 : : 0.049) (0.047 : : 0.049))
   (IOPATH B YB (0.057 : : 0.059) (0.057 : : 0.059))
   (IOPATH C YB (0.066 : : 0.068) (0.066 : : 0.068))
  )
 )
# SDF SYNTAX
# IOPATH INPUT TERMINAL OUTPUT TERMINAL (rise_min : rise_typ : rise_max) (fall_min : fall_typ : fall_max)
```

TIMING ANALYSIS PROGRAM, TIMING ANALYSIS APPARATUS, AND TIMING ANALYSIS METHOD

CROSS-REFERENCE TO RELATED APPLICATIONS

The disclosure of Japanese Patent Application No. 2012-091808 filed on Apr. 13, 2012 including the specification, drawings and abstract is incorporated herein by reference in its entirety.

BACKGROUND

The present invention relates to timing analysis programs, timing analysis apparatuses, and timing analysis methods, and for example, relates to a timing analysis program, a timing analysis apparatus, and a timing analysis method used for semiconductor integrated circuits including various types of transistors having different thresholds.

In recent years, the speeding-up of semiconductor devices has been advancing. As a result, timing restrictions imposed on the setup time and hold time have become very severe. Therefore, at a design stage of semiconductor devices, a timing analysis for verifying timing restrictions is performed as one process of the design stage. An example of generation method of parameters used for this timing analysis is disclosed in Japanese Unexamined Patent Application Publication No. 2007-133497. This publication discloses a technology in which the characteristic distributions of a semiconductor integrated circuit are extracted by a mathematical analysis using polynomial expressions on the basis of the variation distributions of process sensitivity parameters. In the technology disclosed in this publication, variation distributions of the characteristics of a semiconductor integrated circuit are effectively extracted by this method.

SUMMARY

Recently, not only the speeding-up of the operations of semiconductor devices but also the low power consumption of the semiconductor devices has been increasingly needed. Therefore, in order to satisfy both needs for the above characteristics, circuit cells that have plural thresholds are often placed in one semiconductor device. For example, by placing a cell having a low threshold for satisfying the need for a high speed operation, and by placing a cell having a high threshold for satisfying the need for a not so high speed operation, a design that satisfies two specifications for a high speed operation and for low power consumption is achieved.

A semiconductor integrated circuit to which such a design is applied has different variation characteristics for individual circuit cells that have different thresholds. Therefore, the technology disclosed in the above-mentioned patent application publication has a problem in that, although the variation distributions of characteristics of a semiconductor integrated circuit can be extracted, the variation distributions among circuit cells that have different thresholds cannot be extracted. Other problems of the related arts and new features of the present invention will be revealed in accordance with the description about the specification of the present invention and the accompanying drawings hereinafter.

In a timing analysis program, a timing analysis apparatus, and a timing analysis method according to an aspect of the present invention, an analysis condition generation processing, in which a first analysis condition is generated by shifting the variation width of a first delay of a first circuit cell and a second analysis condition is generated by shifting the variation width of a second delay of a second circuit cell, is performed.

In a timing analysis program, a timing analysis apparatus, and a timing analysis method according to another aspect of the present invention, an analysis condition, in which variation components among cells are taken into consideration, can be generated.

BRIEF DESCRIPTION OF THE DRAWINGS

FIG. 2 is a schematic view showing an example of OCV tables according to the first embodiment;

FIG. 3 is a schematic view showing an example of variation coefficient information according to the first embodiment;

FIG. 4 is a schematic view showing an example of analysis information about a first variation direction of a first analysis condition according to the first embodiment;

FIG. 5 is a schematic view showing an example of analysis information about a second variation direction of the first analysis condition according to the first embodiment;

FIG. 12 is a diagram for explaining the types of timing analyses in the timing analysis apparatus according to the first embodiment;

FIG. 21 is a schematic view of delay information included in circuit information which is input to the timing analysis apparatus according to the fifth embodiment; and FIG. 22 is a schematic view of delay information included in analyzed circuit information which is generated as an analysis condition in the timing analysis apparatus according to the fifth embodiment.

DETAILED DESCRIPTION

First Embodiment

Hereinafter, a first embodiment of the present invention will be described with reference to the accompanying drawings. First, a timing analysis apparatus will be described below. This time it will be assumed that this timing analysis apparatus is materialized by making a computing device execute a timing analysis program. However, it is also possible to make hardware materialize the functions executed by the above timing analysis program. In addition, it will be assumed that the timing analysis program is stored in a memory unit which is used along with the timing analysis apparatus for a timing analysis, and this timing analysis program is read out from the memory unit and executed by the computing device.

Alternatively, it is conceivable that the timing analysis program is stored in one of various types of non-transitory computer readable media and is supplied to a computer from the medium. The non-transitory computer readable media include various types of tangible storage media. As examples of non-transitory computer readable media, there are magnetic recording media (for example, a flexible disk, a magnetic tape, a hard disk drive), magneto optical recording media (for example, an magneto optical disk), a CD-ROM (Read Only Memory), a CD-R, a CD-R/W, semiconductor memories (for example, a mask ROM, a PROM (Programmable ROM), an EPROM (Erasable PROM), a flash ROM, a RAM (Random Access Memory)), and the like. It is also conceivable that the timing analysis program can be supplied to the computer via various types of transitory computer readable media. The transitory computer readable media includes electrical signals, optical signals, and electromagnetic waves. The transitory computer readable media can supply the program to the computer via cable communication paths such as a wire and an optical fiber or wireless communication paths.

Figure 1:
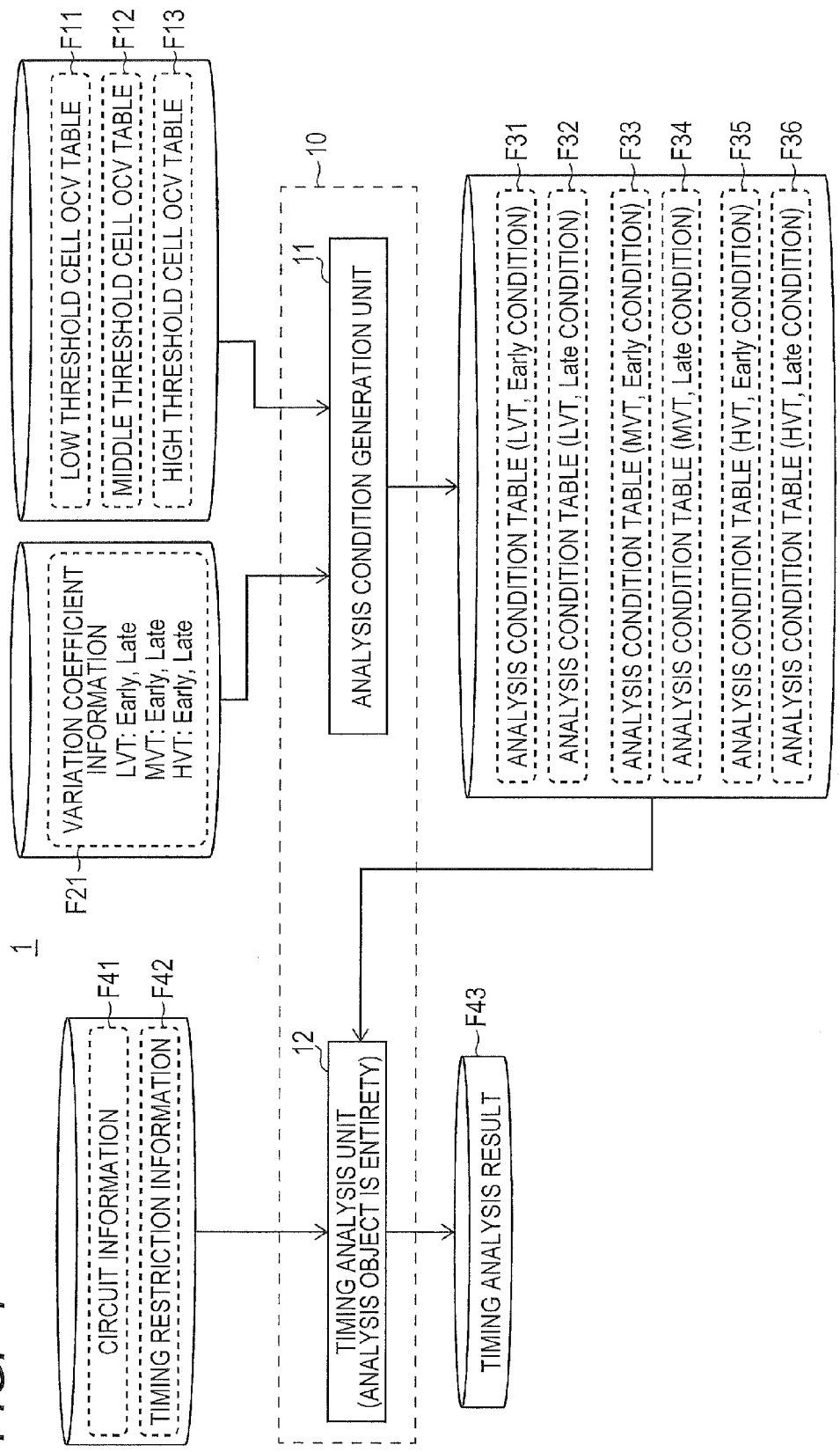
FIG. 1 is a block diagram of a timing analysis apparatus according to a first embodiment.

FIG. 1 shows a block diagram of the timing analysis apparatus 1 according to the first embodiment. As shown in FIG. 1, the timing analysis apparatus 1 includes a computing unit 10 and a memory unit. The computing unit 10 reads out a timing analysis program from the memory unit (not shown), and materializes an analysis condition generation unit 11 and a timing analysis unit 12. The computing unit 10 performs a timing analysis of a design circuit including a first circuit cell having a first delay value and a second circuit cell having a second delay value.

In the following description, a design circuit including three types of cells that have delay values different from each other will be described. One of the three circuit cells corresponds to the first circuit cell, and one of the other two circuit cells corresponds to the second circuit cell. More specifically, a design circuit that is a target of this embodiment includes a low threshold cell that has the largest absolute delay value, a middle threshold cell that has the middle absolute delay value, and a high threshold cell that has the smallest absolute delay value. In addition, one of the low threshold cell, the middle threshold cell, and the high threshold cell corresponds to the first circuit cell, and one of the other two cells corresponds to the second circuit cell.

The analysis condition generation unit 11 reads out variation range information (for example, an OCV table) that defines the variation width of the first delay value of the first circuit cell and the variation width of the second delay value of the second circuit cell from the memory unit. More specifically, the analysis condition generation unit 11 reads out a low threshold cell OCV (On Chip Variation) table F11, a middle threshold cell OCV table F12, and a high threshold cell OCV table F13 from the memory unit.

The low threshold cell OCV table F11 has table information that defines the variation width of the delay value of the low threshold cell. The middle threshold cell OCV table F12 has table information that defines the variation width of the delay value of the middle threshold cell. The high threshold cell OCV table F13 has table information that defines the variation width of the delay value of the high threshold cell. As for the variation widths of the delay values of respective threshold cells, the variation width of the delay value of the low threshold cell is smallest, and that of the high threshold cell is the largest.

In addition, the first and second delay values defined by the OCV tables form table information with variation amounts of signal delay times on the basis of distances between both ends of paths and the numbers of circuit cell stages in the paths.

In addition, the analysis condition generation unit 11 reads out variation coefficient information F21 including a first variation coefficient showing the shift degrees of the variation widths of the first delay values and a second variation coefficient showing the shift degrees of the variation widths of the second delay values from the memory unit. The variation coefficient information F21 includes variation coefficients corresponding to respective circuit cells which have thresholds different from each other. More specifically, the variation coefficient information F21 includes an Early condition and a Late condition of the low threshold cell (referred to as LVT in FIG. 1), an Early condition and a Late condition of the middle threshold cell (referred to as MVT in FIG. 1), and an Early condition and a Late condition of the high threshold cell (referred to as HVT in FIG. 1).

The variation coefficient information F21 includes three variation coefficients, and one of the three variation coefficients corresponds to the first variation coefficient, and one of the other two variation coefficients corresponds to the second variation coefficient. More specifically, one of the variation coefficients respectively corresponding to the low threshold cell, the middle threshold cell, and the high threshold cell corresponds to the first variation coefficient, and one of two variation coefficients corresponding to the other two threshold cells corresponds to the second variation coefficient.

In addition, each of the first and second variation coefficient includes at least one of an Early condition which shows a condition under which the first delay value or second delay value shift to a smaller value and a Late condition under which the first delay value or second delay value shift to a larger value. Here, an Early condition defines the variation ratio of a delay value of a threshold voltage of a transistor forming a cell when the delay value varies in the direction of a smaller value, and a Late condition defines the variation ratio of a delay value of a threshold voltage of a transistor forming the cell when the delay value varies in the direction of a larger value.

The analysis condition generation unit 11 performs analysis condition generation processing in which a first analysis condition is generated by shifting a first variation width on the basis of the first variation coefficient and a second analysis condition is generated by shifting a second variation width on the basis of the second variation coefficient. Here, the timing analysis apparatus 1 generates analysis condition tables as the first analysis condition and as the second analysis condition. The timing analysis apparatus 1 according to the first embodiment generates plural analysis condition tables corresponding to each of the low threshold cell, the middle threshold cell, and the high threshold cell. In this case, one of the plural analysis condition tables corresponding to each of the low threshold cell, the middle threshold cell, and the high threshold cell corresponds to the first analysis condition, and one of the other two analysis condition tables corresponds to the second analysis condition table.

In the timing analysis apparatus 1 according to the first embodiment, one analysis condition includes two analysis condition tables. More specifically, an analysis condition corresponding to the low threshold cell includes an analysis condition table F31 and an analysis condition table F32. The analysis condition table F31 is an OCV table in which the variation width of the delay (defined in the low threshold cell OCV table F11, for example) is shifted on the basis of the variation coefficient defining the Early condition of the low threshold cell. The analysis condition table F32 is an OCV table in which the variation width of the delay (defined in the low threshold cell OCV table F11, for example) is shifted on the basis of the variation coefficient defining the Late condition of the low threshold cell. An analysis condition corresponding to the middle threshold cell includes the analysis condition table F33 and an analysis condition table F34. The analysis condition table F33 is an OCV table in which the variation width of the delay (defined in the middle threshold cell OCV table F12, for example) is shifted on the basis of the variation coefficient defining the Early condition of the middle threshold cell. The analysis condition table F34 is an OCV table in which the variation width of the delay (defined in the middle threshold cell OCV table F12, for example) is shifted on the basis of the variation coefficient defining the Late condition of the middle threshold cell. An analysis condition corresponding to the high threshold cell includes an analysis condition table F35 and an analysis condition table F36. The analysis condition table F35 is an OCV table in which the variation width of the delay (defined in the high threshold cell OCV table F13, for example) is shifted on the basis of the variation coefficient defining the Early condition of the high threshold cell. The analysis condition table F36 is an OCV table in which the variation width of the delay (defined in the high threshold cell OCV table F13, for example) are shifted on the basis of the variation coefficient defining the Late condition of the high threshold cell.

The timing analysis unit 12 performs a timing analysis on a design circuit described in circuit information F41 using the first analysis condition and the second analysis condition. More specifically, the timing analysis unit 12 reads out the circuit information F41 and a timing restriction information F42 from the memory unit, further reads out the analysis condition tables F31 to F36, and performs a timing analysis on the design circuit described in the circuit information F41 using the delay values described in the analysis condition tables. In other words, the timing analysis unit 12 judges whether the signal transmission timings of paths that couple circuit cells included in the circuit information F41 violate a timing restriction defined in the timing restriction information F42 or not, and outputs the judgment result as a timing analysis result F43.

Subsequently, the OCV tables which are used as variation range information in the timing analysis apparatus 1 according to the first embodiment will be described in detail. FIG. 2 is a schematic view showing an example of the OCV tables according to the first embodiment. The OCV table shown in FIG. 2 is the middle threshold cell OCV table F12 shown as an example of the OCV tables.

The OCV table that is used for variation information as shown in FIG. 2 includes a table in which the Late side derating values showing the upper values of the variation widths of delay values (for example, MAX-Hold-Late) is defined and a table in which the Early side derating value showing the lower values of the variation widths of delay values (for example, MAX-Hold-Early) is defined. In addition, there is the description that defines the threshold of a cell (for example, Cell MVT) in each table. In addition, in the row next to the row in which the threshold of the cell is defined, there are descriptions about the numbers of stages included in analysis object paths. The columns of the OCV table include derating values corresponding to the respective numbers of stages of this cell circuit. In addition, there is a description about distances D between both ends of the analysis object signal path in a row next to the row where there is the description about the numbers of stages. The rows of the OCV table include derating values respectively corresponding to these distances. The rows following the row, which includes a description about distances D between both ends of the path, form the OCV table. In the example shown in FIG. 2, the first row of the OCV table includes table information about derating values when the distance=0, and the second row includes table information about derating values when the distance=500.

Next, the variation coefficient information used in the timing analysis apparatus 1 according to the first embodiment will be described in detail. FIG. 3 is a schematic view showing an example of the variation coefficient information according to the first embodiment. As shown in FIG. 3, the variation coefficient information includes signs to distinguish the types of cells to which variations are allocated, and Early condition values and Late condition value values corresponding to the respective types of cells. For example, a description about a low threshold cell includes the sign showing the type of the cell (LVT), and 0.956 as an Early condition value and 1.050 as a Late condition value.

Next, the analysis condition table generated in the timing analysis apparatus 1 according to the first embodiment will be described in detail. FIG. 4 and FIG. 5 are two schematic views respectively showing examples of analysis information about a first variation direction and analysis information about a second variation direction of the first analysis condition according to the first embodiment. FIG. 4 shows the analysis condition table F33 which is an example of analysis condition table obtained by modifying the OCV table on the basis of the corresponding Early condition. In a similar way, FIG. 5 shows the analysis condition table F34 which is an example of analysis condition table obtained by modifying the OCV table on the basis of the corresponding Late condition.

As shown in FIG. 4, the analysis condition table F33 includes values obtained by multiplying the derating values of the OCV table shown in FIG. 2 by 0.946, that is, an Early condition value of the middle threshold cell shown in FIG. 3, as derating values. In a similar way, as shown in FIG. 5, the analysis condition table F34 includes values obtained by multiplying the derating values of the OCV table shown in FIG. 2 by 1.043, that is, a Late condition value of the middle threshold cell shown in FIG. 3, as derating values.

Hereinafter, the relationship between the variation widths of delay values given by an OCV table, which is input to the timing analysis apparatus 1 according to the first embodiment, and the variation widths of delay values shown by the corresponding analysis condition table generated by the timing analysis apparatus 1 will be described.

Figure 6:
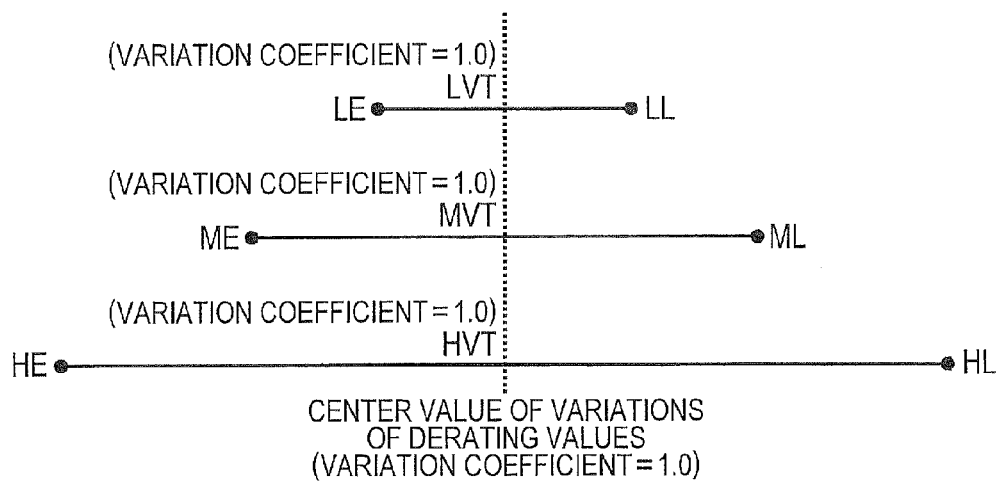
FIG. 6 is a schematic view showing variation ranges of derating values defined by OCV tables used in the timing analysis apparatus according to the first embodiment.

First, FIG. 6 shows a schematic view showing the variation ranges of derating values defined by the OCV table used by the timing analysis apparatus according to the first embodiment. The variation ranges corresponding to the respective circuit cells shown in FIG. 6 are normalized by the central values of the variation ranges given to the respective circuit cells. As shown in FIG. 6, in the OCV table input to the timing analysis apparatus 1, the variation range for the low threshold cell is the narrowest, and the variation range for the high threshold cell is the widest.

In addition, in the example shown in FIG. 6, the upper limit value and the lower limit vale of each variation range are respectively given signs. More specifically, the variation range of delay value of the low threshold cell LVT has a range shown by the lower limit value LE and the upper limit value LL. The variation range of delay value of the middle threshold cell MVT has a range shown by the lower limit value ME and the upper limit value ML. The variation range of delay value of the high threshold cell HVT has a range shown by the lower limit value HE and the upper limit value HL.

Figure 7:
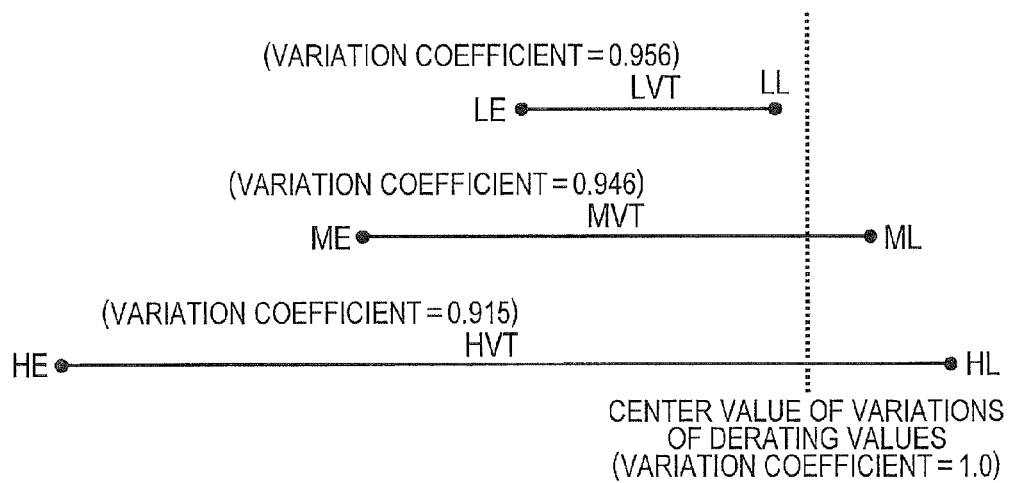
FIG. 7 is a schematic view showing variation ranges of derating values defined by analysis conditions used in the timing analysis apparatus according to the first embodiment.

Next, FIG. 7 shows a schematic view showing the variation ranges of derating values defined by an analysis condition used by the timing analysis apparatus according to the first embodiment. The analysis condition table shown in FIG. 7 is generated by applying Early condition values as variation coefficients to the input OCV table. As shown in FIG. 7, the analysis condition table generated by applying the Early conditions to the input OCV table is updated so that its variation ranges are shifted to the Early side (in other words, to the side of the derating values becoming smaller) compared with the case where the variation coefficient=1.0 (in other words, the case where the variation coefficient is not used). To it more concretely, each variation range is shifted to the Early side with its variation width, which is shown in FIG. 6, nearly unchanged.

Figure 8:
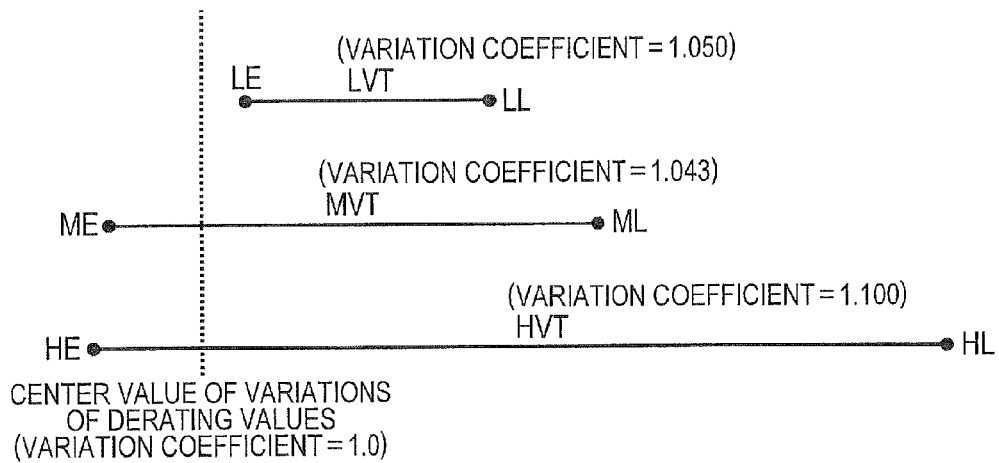
FIG. 8 is a schematic view showing variation ranges of derating values defined by analysis conditions used in the timing analysis apparatus according to the first embodiment.

In addition, FIG. 8 shows a schematic view showing the variation ranges of derating values defined by another analysis condition used by the timing analysis apparatus according to the first embodiment. The analysis condition table shown in FIG. 8 is generated by applying a Late condition values as variation coefficients to the input OCV table. As shown in FIG. 8, the analysis condition table generated by applying the Late conditions to the input OCV table is updated so that its variation ranges are shifted to the Late side (in other words, to the side of the derating value becoming a larger value) compared with the case where the variation coefficient=1.0 (in other words, the case where the variation coefficient is not used). To it more concretely, each variation range is shifted to the Early side with its variation width, which is shown in FIG. 6, nearly unchanged.

In the timing analysis apparatus 1 according to the first embodiment, a timing analysis is performed with reference to an analysis condition table corresponding to each circuit cell. In addition, in the timing analysis apparatus 1 according to the first embodiment, a timing analysis is performed using all combinations of analysis condition tables generated by applying the Early condition and analysis condition tables generated by applying the Late condition for respective circuit cells. Hereinafter, the timing analysis processing performed in the timing analysis apparatus 1 will be described in detail.

Figure 9:
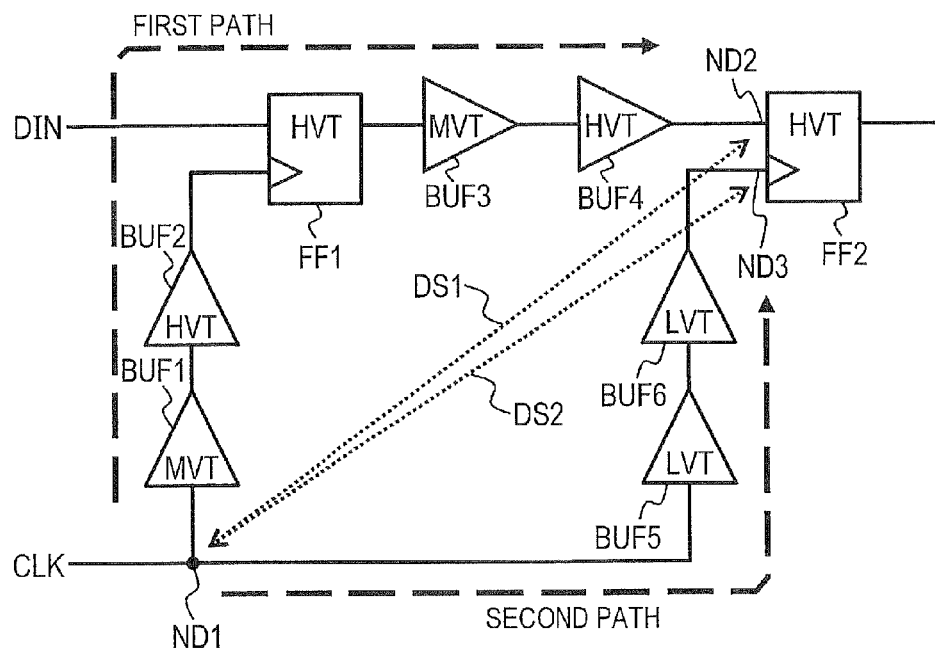
FIG. 9 is a circuit diagram showing an example of a circuit that is an analysis object in the timing analysis apparatus 1 according to the first embodiment.

First, a circuit diagram showing an example of a circuit that is an analysis object in the timing analysis apparatus 1 according to the first embodiment is shown in FIG. 9. The circuit example shown in FIG. 9 includes flip-flops FF1 and FF2, and buffer circuits BUF1 to BUF6.

The flip-flop FF1 holds data DIN using a clock signal CLK obtained via buffer circuits BUF1 and BUF2. The flip-flop FF2 holds data output by the flip-flop FF1 using the clock signal CLK obtained via buffer circuits BUF5 and BUF6. In addition, there are a buffer circuit BUF3 and a buffer circuit BUF4 between the flip-flop FF1 and the flip-flop FF2.

Figure 10:
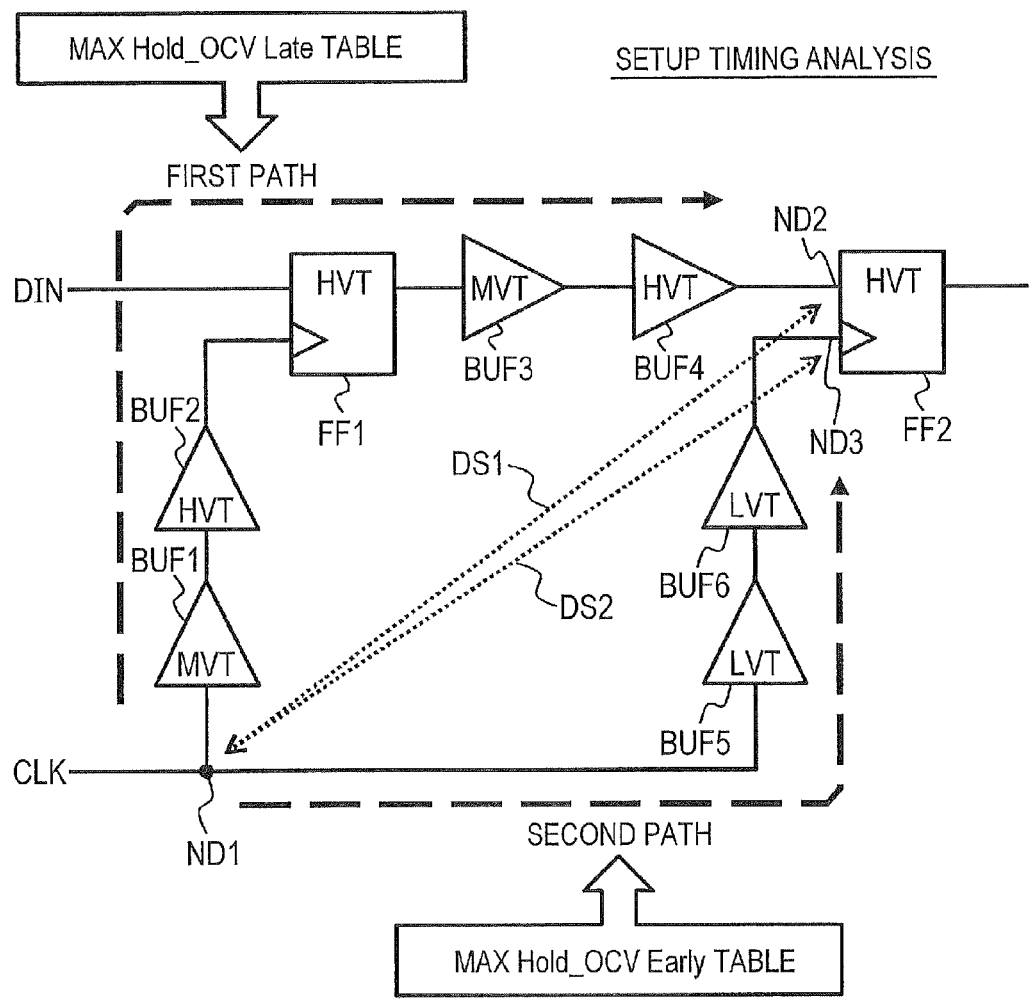
FIG. 10 is a diagram for explaining OCV tables used in a timing analysis of a setup time in the timing analysis apparatus according to the first embodiment.

Here, in a circuit example shown in FIG. 10, it will be assumed that the buffer circuits BUF1 and BUF3 comprise middle threshold cells, the flip-flops FF1 and FF2, and the buffer circuits BUF2 and BUF4 comprise high threshold cells, and the buffer circuits BUF5 and BUF6 comprise low threshold cells. A route, through which a clock signal CLK is transmitted, bisects at a node ND1. A node ND2 is assigned to the data input terminal of the flip-flop FF2, and a node ND3 is assigned to the clock input terminal of the flip-flop FF2. In addition, a distance DS1 in terms of layout data is set between the node ND1 and the node ND2, and a distance DS2 in terms of layout data is set between the node ND1 and the node ND3.

In this case, a route from the node ND1 to the node ND2 is a first path that is an object of the timing analysis, and a route from the node ND1 to the node ND3 is a second path that is also an object of the timing analysis. In the timing analysis, it is verified whether the relationship between the timing of signal transmission through the first path and the timing of signal transmission through the second path can satisfy the requirements of the setup time and hold time of the analysis object circuit or not.

More specifically, the first path includes five-stage circuit cells, that is, the buffer circuits BUF1 to BUF4, and the flip-flop FF1. In addition, the first path has a distance DS1. The second path includes two-stage circuits, that is, the buffer circuits BUF5 and BUF6. In addition, the second path has a distance DS2. Therefore, with regard to the first path, the timing analysis apparatus 1 reads out derating values corresponding to five-stage cells in the rows corresponding to the distance DS1 in the OCV tables defined in the analysis condition tables F31 to F36. In addition, with regard to the second path, the timing analysis apparatus 1 reads out derating values corresponding to two-stage cells in the rows corresponding to the distance DS2 in the OCV tables defined in the analysis condition tables F31 to F36.

More specifically, with regard to the buffer circuits BUF1 and BUF3, the timing analysis apparatus 1 reads out derating values corresponding to five-stage circuit cells in the rows corresponding to the distance DS1 in the analysis condition tables F33 and F34 which correspond to middle threshold cells. In addition, with regard to the flip-flop FF1 and the buffer circuits BUF2 and BUF4, the timing analysis apparatus 1 reads out derating values corresponding to five-stage circuit cells in the rows corresponding to the distance DS1 in the analysis condition tables F35 and F36 which correspond to high threshold cells. In addition, with regard to the buffer circuits BUF5 and BUF6, the timing analysis apparatus 1 reads out derating values corresponding to two-stage circuit cells in the rows corresponding to the distance DS2 in the analysis condition tables F31 and F32 which correspond to low threshold cells.

Next, the types of analysis condition tables used when the timing analysis apparatus 1 performs a timing analysis will be described. As shown in FIG. 4 and FIG. 5, one analysis condition table includes a MAX-Hold-Late table and a MAX-Hold-Early table. In a setup timing analysis and a hold timing analysis, the timing analysis apparatus 1 performs each timing analysis by selecting a condition that makes each timing severe.

FIG. 10 is a diagram for explaining an OCV table used when a timing analysis regarding a setup time is performed in the timing analysis apparatus according to the first embodiment. In addition, FIG. 11 is a diagram for explaining an OCV table used when a timing analysis regarding a hold time is performed in the timing analysis apparatus according to the first embodiment.

As shown in FIG. 10, when the setup timing analysis is performed, MAX-Hold-Late tables are selected for the first path, and MAX-Hold-Early tables are selected for the second path. This is because the situation in which the timing when the clock signal CLK reaches the flip-flop FF2 is earlier than the timing when data reaches the flip-flop FF2 is the severest condition for a setup timing.

Figure 11:
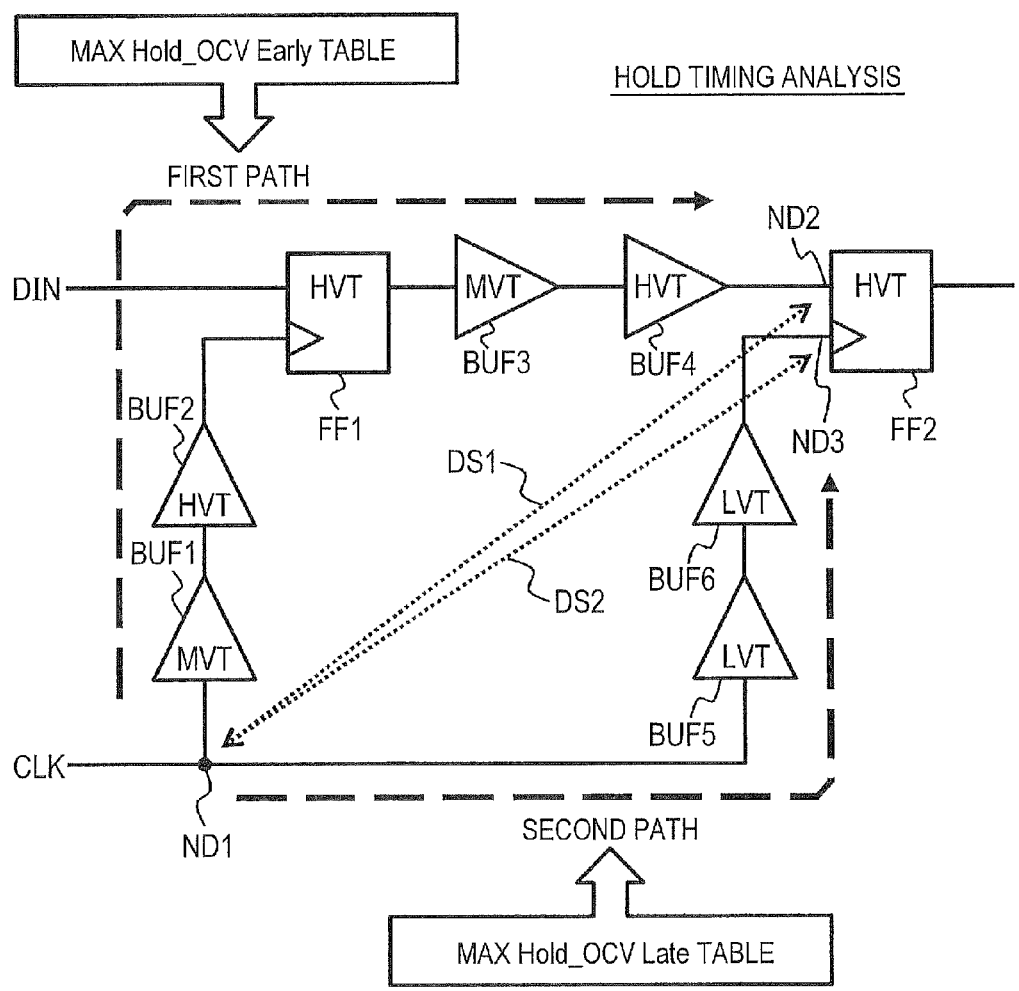
FIG. 11 is a diagram for explaining OCV tables used in a timing analysis of a hold time in the timing analysis apparatus according to the first embodiment.

As shown in FIG. 11, when the hold timing analysis is performed, the MAX-Hold-Early tables are selected for the first path, and the MAX-Hold-Late tables are selected for the second path. This is because the situation in which the timing when the clock signal reaches the flip-flop FF2 is later than the timing when the data reaches the flip-flop FF2 is the severest condition for a hold timing.

In the timing analysis apparatus 1 according to the first embodiment, an analysis condition table is generated for each of the combinations of the types of circuit cells and the corresponding variation coefficients. Next, one timing analysis is performed for each of all the combinations of the variation coefficients. In this case, the timing analysis apparatus 1 performs each of the timing analyses in the above-described procedures. Hereinafter, the combinations of the variation coefficients used for the analyses by the timing analysis apparatus 1 according to the first embodiment will be described.

FIG. 12 shows a diagram for explaining the types of the timing analyses performed by the timing analysis apparatus 1 according to the first embodiment. As shown in FIG. 12, analysis condition tables are generated by combining three types of the circuit cells with the two variation coefficients in the timing analysis apparatus 1 according to the first embodiment. Therefore, the number of analysis conditions used for the timing analyses becomes 8 ($2^3$).

In an analysis with a timing analysis number 1, the timing analysis apparatus 1 performs a timing analysis using analysis condition tables in which the Early conditions are applied to all circuit cells (for example, the analysis condition tables F31, F33, and F35). In an analysis with a timing analysis number 2, the timing analysis apparatus 1 performs a timing analysis using analysis condition tables in which the Early condition is applied to the high threshold cells HVT and the middle threshold cells MVT (for example, the analysis condition tables F35 and F33) and using an analysis condition table in which the Late condition is applied to the low threshold cells LVT (for example, the analysis condition table F32). In an analysis with a timing analysis number 3, the timing analysis apparatus 1 performs a timing analysis using analysis condition tables in which the Early condition is applied to the high threshold cells HVT and the low threshold cells LVT (for example, the analysis condition tables F35 and F31) and using an analysis condition table in which the Late condition is applied to middle threshold cells MVT (for example, the analysis condition table F34). In an analysis with a timing analysis number 4, the timing analysis apparatus 1 performs a timing analysis using an analysis condition table in which the Early condition is applied to the high threshold cells HVT (for example, the analysis condition table F35) and using analysis condition tables in which the Late condition is applied to the middle threshold cells MVT and the low threshold cells LVT (for example, the analysis condition tables F34 and F32).

In an analysis with a timing analysis number 5, the timing analysis apparatus 1 performs a timing analysis using an analysis condition table in which the Late condition is applied to the high threshold cells HVT (for example, the analysis condition table F36) and using analysis condition tables in which the Early condition is applied to the middle threshold cells MVT and the low threshold cells LVT (for example, the analysis condition tables F33 and F31). In an analysis with a timing analysis number 6, the timing analysis apparatus 1 performs a timing analysis using analysis condition tables in which the Late condition is applied to the high threshold cells HVT and the low threshold cells LVT (for example, the analysis condition tables F36 and F32) and using an analysis condition table in which the Early condition is applied to the middle threshold cells MVT (for example, the analysis condition table F33). In an analysis with a timing analysis number 7, the timing analysis apparatus 1 performs a timing analysis using analysis condition tables in which the Late condition is applied to the high threshold cells HVT and the middle threshold cells MVT (for example, the analysis condition tables F36 and F34) and using an analysis condition table in which the Early condition is applied to the low threshold cells LVT (for example, the analysis condition table F31). In an analysis with a timing analysis number 8, the timing analysis apparatus 1 performs a timing analysis using analysis condition tables in which the Late condition is applied to all circuit cells (for example, the analysis condition tables F36, F34, and F33).

As described above, the timing analysis apparatus 1 according to the first embodiment shifts the variation widths of delay values of respective circuit cells shown by the OCV tables, which define delay values for respective types of circuit cells, using the variation coefficients. As a result of the above procedures, analysis conditions that reflect variations among circuit cells having different delay characteristics to the variations of delay values can be easily generated.

In addition, using the analysis conditions generated in such a way enables the reduction of excess timing margins, which leads to the reduction of circuit sizes and the reduction of power consumption of semiconductor integrated circuit apparatuses. More specifically, if, for example, a timing analysis is performed in consideration of variations among circuit cells having different delay characteristics without using the analysis condition generation unit 11 according to this embodiment, it is necessary to multiply the upper values of the variation ranges defined by the OCV tables F11 to F13 by corresponding values at the Early sides of variation coefficients of the circuit cells respectively and multiply the lower values by corresponding values at the Late sides of variation coefficients of the circuit cells respectively to generate new variation ranges. Therefore, if OCV tables are generated in consideration of the variations among circuit cells having different delay characteristics without using the analysis condition generation unit 11, variation ranges defined by the OCV tables respectively appear in the forms of the variation ranges shown in FIG. 6 that are extended to right and left. In the case where such OCV tables are used, variation conditions, in which variation coefficients for low threshold cells are variation coefficients at the Early side, and variation coefficients for middle threshold cells are variation coefficients at the Late side, cause a problem in a timing analysis and the like. More specifically, in such a case as above, an upper side derating value for the low threshold cells and a lower side derating value for middle threshold cells generate excess margins that are not really generated in actual manufacturing variations, and there arises a problem in that the sizes of circuits and power consumption are increased in order to satisfy these excess margins. In addition, if a design of a circuit is made in consideration of such excess margins, there arises a problem in that it takes a lot of time for a timing analysis regarding the circuit to converge.

On the other hand, the analysis condition tables generated in the timing analysis apparatus 1 according to the first embodiment are the plural analysis condition tables F31 to F36 that include variation components that might actually be generated among circuit cells having different delay characteristics. Therefore, by using these analysis condition tables F31 to F36, timing analyses that are not accompanied by excess margins can be performed. In addition, by performing the timing analyses using the analysis condition tables F31 to F36, the reduction of circuit areas and the reduction of power consumption of semiconductor integrated circuits can be realized. In addition, by performing the timing analyses using the analysis condition tables F31 to F36, the design time for semiconductor integrated circuits can be reduced.

Second Embodiment

Figure 13:
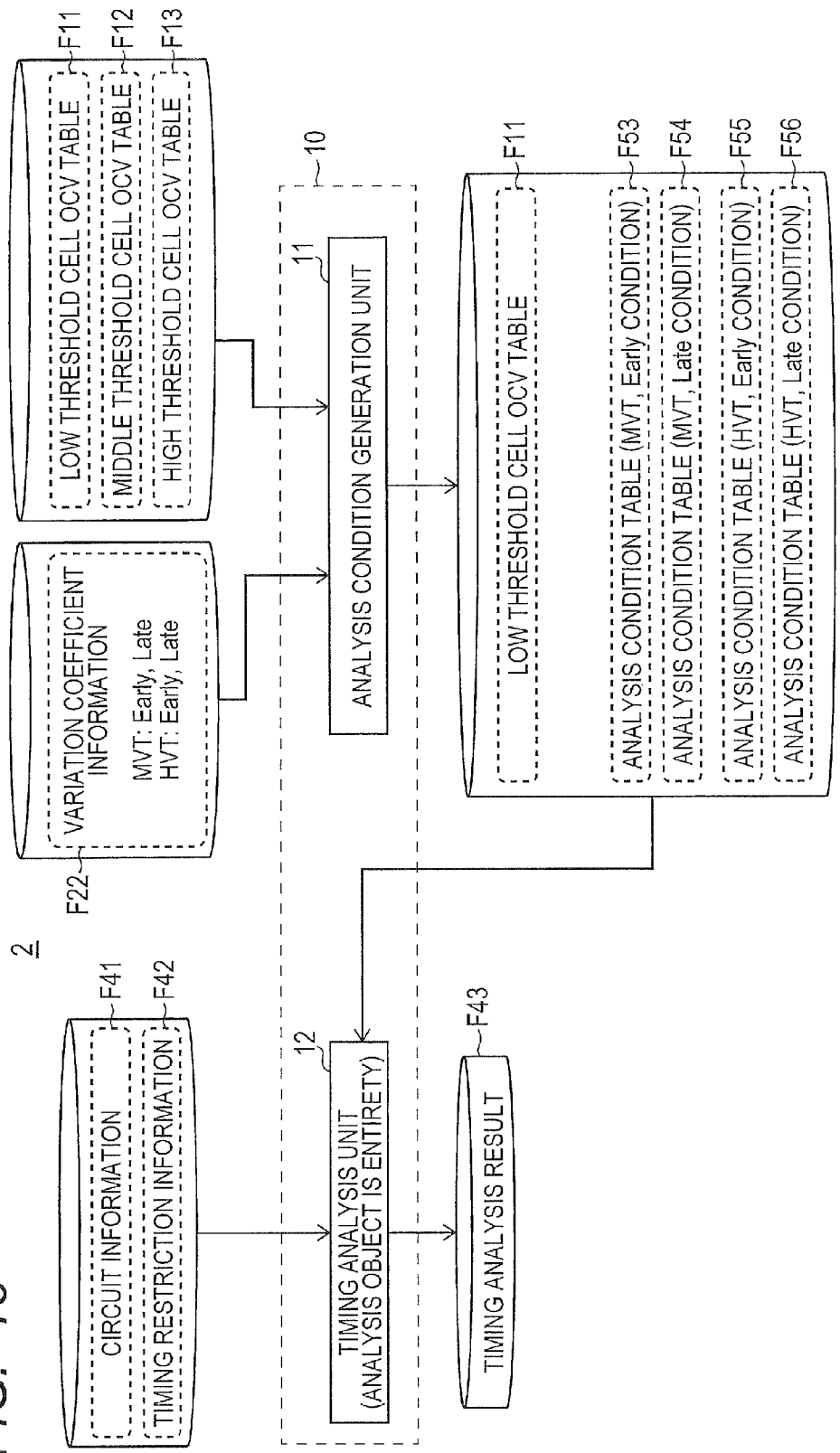
FIG. 13 is a block diagram of a timing analysis apparatus according to a second embodiment.

In a second embodiment, another example of variation coefficient information will be described. First, a block diagram showing a timing analysis apparatus 2 according to the second embodiment is shown in FIG. 13. As shown in FIG. 13, in the timing analysis apparatus 2, the number of variation coefficients included in variation coefficient information F22, which is input to the analysis condition generation unit 11, is smaller than the number of types of circuit cells included in a design circuit.

In addition, in the timing analysis apparatus 2, because the number of variation coefficients is smaller, the number of generated analysis condition tables is smaller. In an example shown in FIG. 13, the low threshold cell OCV table F11 is used as it is as an analysis condition table corresponding to the low threshold cell LVT. In addition, in the timing analysis apparatus 2 according to the second embodiment, analysis condition tables F53 to F56 are generated. The analysis condition table F53 is generated by applying a variation coefficient of the Early condition to the middle threshold cell OCV table F12 corresponding the middle threshold cell MVT. The analysis condition table F54 is generated by applying a variation coefficient of the Late condition to the middle threshold cell OCV table F12 corresponding the middle threshold cell MVT. The analysis condition table F55 is generated by applying a variation coefficient of the Early condition to the high threshold cell OCV table F13 corresponding the high threshold cell HVT. The analysis condition table F56 is generated by applying a variation coefficient of the Late condition to the high threshold cell OCV table F13 corresponding the high threshold cell HVT.

In the second embodiment, one of first and second variation coefficients includes a coefficient that makes the shift degrees of the variation widths of a delay value zero, and the other of the first and second variation coefficients includes coefficients that show the shift degrees of the variation widths of a first delay value and the shift degrees of the variation widths of a second delay value. As a result, in the timing analysis apparatus 2 according to the second embodiment, information about the variation coefficients whose number is equal to the number of types of circuit cells can be included in the variation coefficients whose number is smaller than the number of types of the circuit cells.

Figures 14, 15:
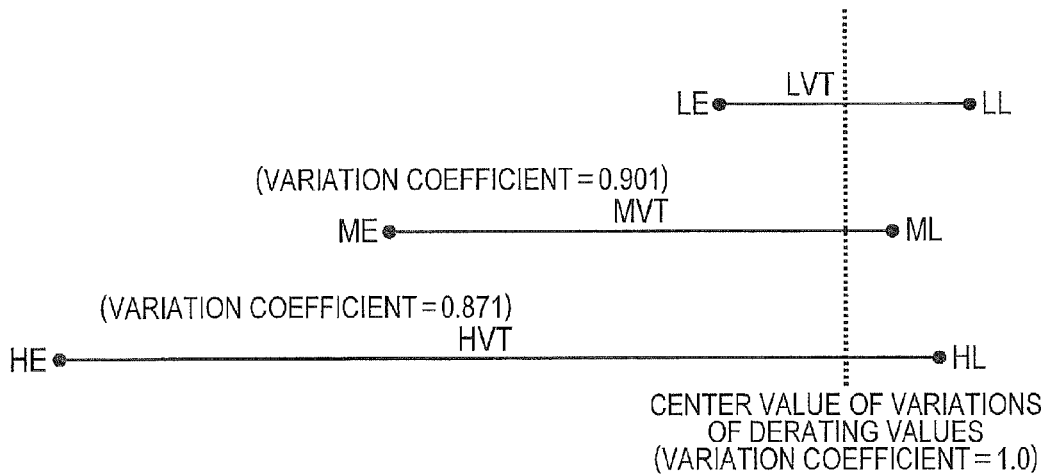
FIG. 14 is a schematic view showing an example of variation coefficient information according to the second embodiment.
FIG. 15 is a schematic view showing variation ranges of derating values defined by analysis conditions used in a timing analysis apparatus according to the second embodiment.

More specifically, in the second embodiment, one of the first and second variation coefficients includes a variation coefficient corresponding to the low threshold cell LVT, and because an Early condition value and a Late condition value in this variation coefficient corresponding to the low threshold cell LVT are both 1.0, these values are not written. In addition, in the second embodiment, the other of the first and second variation coefficients includes a variation coefficient corresponding to the middle threshold cell MVT, and a variation coefficient corresponding to the high threshold cell HVT. In addition, the shift degree components of the variation coefficients corresponding to the low threshold cell LVT are respectively added to an Early condition value and a Late condition value of the variation coefficient corresponding to the middle threshold cell MVT and an Early condition value and a Late condition value of the variation coefficient corresponding to the high threshold cell HVT. Here, FIG. 14 is a schematic view showing an example of variation coefficient information used by the timing analysis apparatus 2 according to the second embodiment. The variation coefficient information F22 used by the timing analysis apparatus 2 according to the second embodiment will be described with reference to FIG. 14.

As shown in FIG. 14, because the shift degrees of the variation widths of the delay value corresponding to the low threshold cell LVT are made zero, the shift values are not written in the variation coefficient information F22. In the case where the variation coefficient corresponding to the low threshold cell LVT is written, it is all right that the corresponding Early value and Late value are both set 1.0.

In addition, in the variation coefficient information F22, the shift degree components of the variation coefficients corresponding to the low threshold cell LVT are respectively added to the variation coefficient corresponding to the middle threshold cell MVT and the variation coefficient corresponding to the high threshold cell HVT. More specifically, in the variation coefficient information F22, if threshold coefficients shown in FIG. 3 are referred to original variation coefficients, a variation coefficient MVT_Early of the Early condition corresponding to the middle threshold cell MVT is given by Equation (1). Here, in Equation (1), MVT_Early_original is the variation coefficient of the Early condition corresponding to the middle threshold cell MVT shown in FIG. 3, and LVT_Late_original is the variation coefficient of the Late condition corresponding to the low threshold cell LVT shown in FIG. 3.

$$MVT\_Early = MVT\_Early\_original / LVT\_Late\_original \quad (1)$$

In addition, a variation coefficient MVT_Late of the Early condition corresponding to the middle threshold cell MVT is given by Equation (2). Here, in Equation (2), MVT_Late_original is the variation coefficient of the Late condition corresponding to the middle threshold cell MVT shown in FIG. 3, and LVT_Early_original is the variation coefficient of the Early condition corresponding to the low threshold cell LVT shown in FIG. 3.

$$MVT\_Late = MVT\_Late\_original / LVT\_Early\_original \quad (2)$$

In addition, a variation coefficient HVT_Early of the Early condition corresponding to the high threshold cell HVT is given by Equation (3). Here, in Equation (3), HVT_Early_original is the variation coefficient of the Early condition corresponding to the high threshold cell HVT shown in FIG. 3, and LVT_Late_original is the variation coefficient of the Late condition corresponding to the low threshold cell LVT shown in FIG. 3.

$$HVT\_Early = HVT\_Early\_original / LVT\_Late\_original \quad (3)$$

In addition, a variation coefficient HVT_Late of the Late condition corresponding to the high threshold cell HVT is given by Equation (4). Here, in Equation (4), HVT_Late_original is the variation coefficient of the Late condition corresponding to the high threshold cell HVT shown in FIG. 3, and LVT_Early_original is the variation coefficient of the Early condition corresponding to the low threshold cell LVT shown in FIG. 3.

$$HVT\_Late=HVT\_Late\_original/LVT\_Early\_original \quad (4)$$

As described above, by adding the components of the variation coefficients corresponding to the low threshold cell LVT to the variation coefficient corresponding to the middle threshold cell MVT and the variation coefficient corresponding to the high threshold cell HVT, variations of the variation coefficients corresponding to the low threshold cell LVT relative to the variation coefficients corresponding to other threshold cells can be reflected to the variation coefficients written in the variation coefficient information F22.

Figures 16, 17:
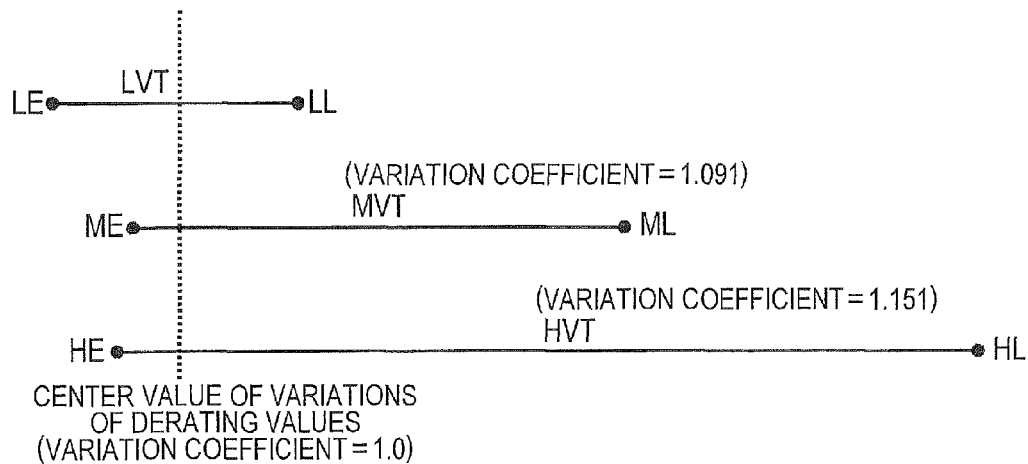
FIG. 16 is a schematic view showing variation ranges of derating values defined by an analysis conditions used in the timing analysis apparatus according to the second embodiment.
FIG. 17 is a diagram for explaining the types of timing analyses in the timing analysis apparatus according to the second embodiment.

Next, FIG. 15 and FIG. 16 are schematic views showing variation ranges of derating values defined by analysis conditions used in the timing analysis apparatus according to the second embodiment. An example shown by FIG. 15 shows variation ranges of derating values shown by the low threshold cell OCV table F11, the analysis condition table F53, and the analysis condition table F55. As shown in FIG. 15, the analysis condition tables F53 and F55 that are generated by the timing analysis apparatus 2 according to the second embodiment show variation ranges shifted to the Early side (to the side of the derating values becoming smaller) compared with a case where the variation coefficients applied to derating values are 1.0 (in other words, the variation coefficients are not applied to the derating values). More specifically, the variation ranges of the derating values shown by the middle threshold cell MVT and the high threshold cell HVT, that is, the variation widths between the corresponding upper values and the lower values, become a little larger than the ranges shown in FIG. 6 and are shifted to the Early side. On the other hand, the variation range of the derating value shown by the low threshold cell LVT is shown by the low threshold cell OCV table F11 and remains unchanged.

Next, an example shown by FIG. 16 shows variation ranges of derating values shown by the low threshold cell OCV table F11, the analysis condition table F54, and the analysis condition table F56. As shown in FIG. 16, the analysis condition tables F54 and F56 that are generated by the timing analysis apparatus 2 according to the second embodiment show variation ranges shifted to the Late side (to the side of the derating values becoming larger) compared with a case where the variation coefficients applied to derating values are 1.0 (in other words, the variation coefficients are not applied to the derating values). More specifically, the variation ranges of the derating values shown by the middle threshold cell MVT and the high threshold cell HVT, that is, the variation widths between the corresponding upper values and the lower values, become a little larger than the ranges shown in FIG. 6 and are shifted to the Late side. On the other hand, the variation range of the derating value shown by the low threshold cell LVT is shown by the low threshold cell OCV table F11 and remains unchanged.

In the timing analysis apparatus 2 according to the second embodiment, an analysis condition table is generated for each of combinations of the types of circuit cells and the variation coefficients. Next, one timing analysis is performed for each of all the combinations of the variation coefficients. In this case, the timing analysis apparatus 2 performs each of the timing analyses in the above-described procedures as is the case with the timing analysis apparatus 1 according to the first embodiment. Hereinafter, the combinations of the variation coefficients used for the analyses by the timing analysis apparatus 2 according to the second embodiment will be described.

FIG. 17 shows a diagram for explaining the types of the timing analyses performed by the timing analysis apparatus 2 according to the second embodiment. As shown in FIG. 17, in the timing analysis apparatus 2 according to the second embodiment, an analysis condition table is generated by combining one of the two types of the circuit cells with one of the two variation coefficients because only one analysis condition (for example, the low threshold cell OCV table F11) is given to the low threshold cells. Therefore, the number of analysis conditions used for the timing analyses becomes 4 ($2^2$).

In an analysis with a timing analysis number 1, the timing analysis apparatus 2 performs a timing analysis using analysis condition tables in which the Early conditions are applied to the high threshold cells HVT and the middle threshold cells MVT (for example, the analysis condition tables F55 and F53). In an analysis with a timing analysis number 2, the timing analysis apparatus 2 performs a timing analysis using analysis condition table in which the Early condition is applied to the high threshold cells HVT (for example, the analysis condition tables F55) and using an analysis condition table in which the Late condition is applied to the middle threshold cells MVT (for example, the analysis condition table F54). In an analysis with a timing analysis number 3, the timing analysis apparatus 2 performs a timing analysis using analysis condition table in which the Late condition is applied to the high threshold cells HVT (for example, the analysis condition tables F56) and using an analysis condition table in which the Early condition is applied to the middle threshold cells MVT (for example, the analysis condition table F53). In an analysis with a timing analysis number 4, the timing analysis apparatus 2 performs a timing analysis using analysis condition tables in which the Late condition is applied to the high threshold cells HVT and the middle threshold cells MVT (for example, the analysis condition tables F56 and F54).

As described above, in the timing analysis apparatus 2 according to the second embodiment, one variation coefficient is used as a criterion, and the original coefficient components of the coefficient that is used as the criterion is added to the other variation coefficients. As a result of the above procedures, in the timing analysis apparatus 2 according to the second embodiment, the timing analysis in which the relative variations among all the circuit cells taken into consideration can be performed with the number of analysis conditions reduced, while covering the circuit cells the number of which is larger than the number of the variations as analysis objects. In addition, the timing analysis according to the second embodiment enables the time needed for performing the timing analysis to be reduced in accordance with the reduction of the number of the analysis conditions.

In the above description, an embodiment has been described in which, using a variation coefficient of one circuit cell (for example, the low threshold cell LVT) as a criterion, the variation coefficients of the other circuit cells (for example, the middle threshold cell MVT and the high threshold cell HVT) are modified. These modified variation coefficients have values to which the shifts of delay times generated owing to the variations among threshold voltages of the circuit cells are reflected. In addition, the variation coefficients originally set for the respective circuit cells are given on the basis the variation amounts of the absolute delays of the circuit cells.

Therefore, there is a possibility that the variation coefficients defined by the variation coefficient information F22, which shows the shift degrees of variation widths of delay values, include excess margins in the analysis conditions generated in the second embodiment. Therefore, without setting the variation coefficient information F22 on the basis of the absolute values of the variations of threshold voltages of the circuit cells, and by evaluating the correlation between the variations of the threshold voltages of the circuit cells in the evaluation phase and setting the variation coefficient information F22 in accordance with the evaluation, the excess margins can be reduced. In other words, if there is a variation of a threshold voltage whose absolute value has a high correlation between the absolute values of variations of the threshold voltages, by setting the values of the variation coefficient information F22 using the absolute value of the variation that has the high correlation as a criterion, the reduction of the excess margin can be achieved.

Third Embodiment

Figure 18:
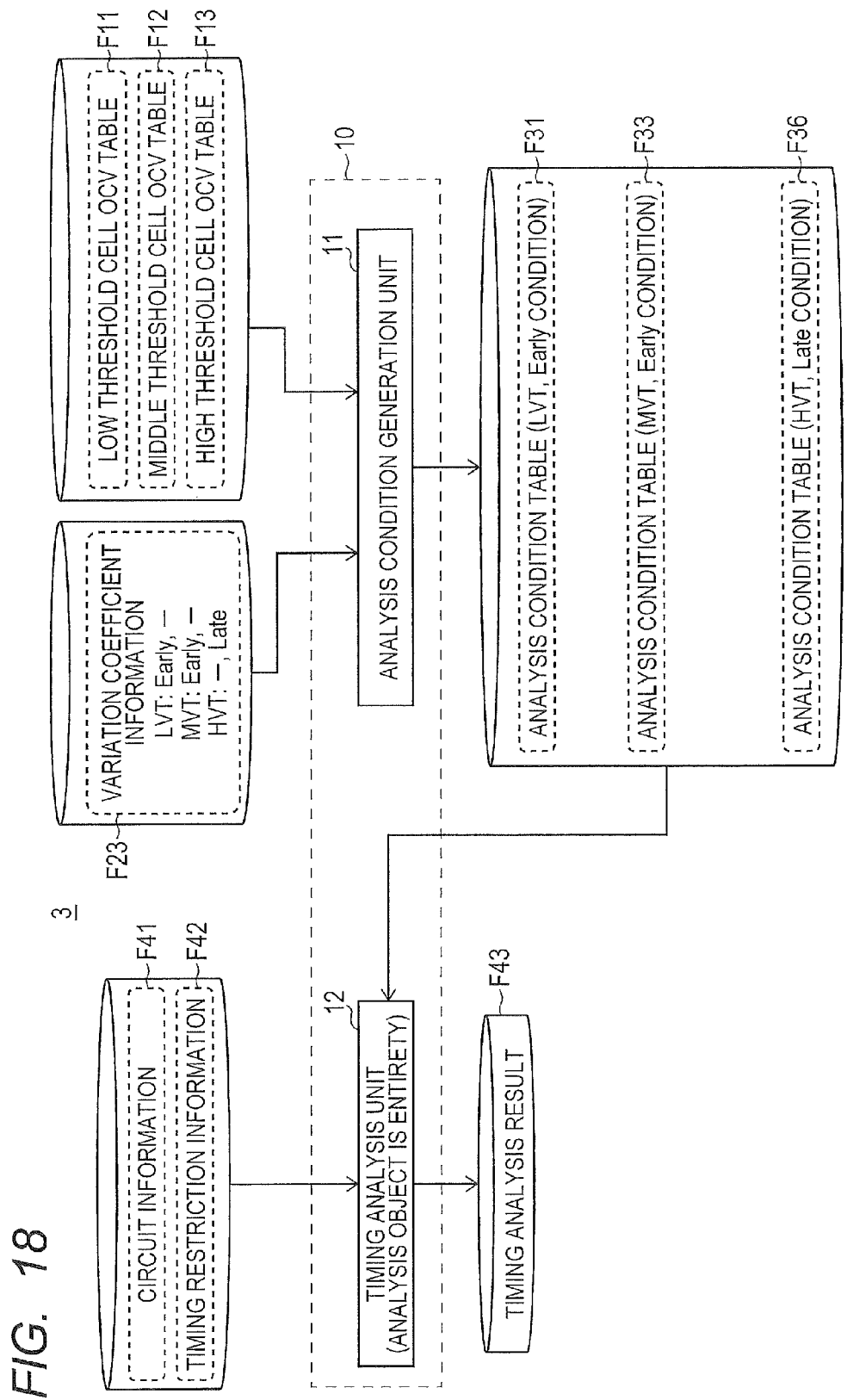
FIG. 18 is a block diagram of a timing analysis apparatus according to a third embodiment.

In a third embodiment, another example of reduction method of variation coefficients will be described. FIG. 18 is a block diagram of a timing analysis apparatus 3 according to a third embodiment. As shown in FIG. 18, the timing analysis apparatus 3 includes variation information F23 instead of the variation information F21 shown in FIG. 3. In addition, the timing analysis apparatus 3 includes the analysis condition tables F31, F33, and F36 instead of the analysis condition tables F31 to F36 included by the first embodiment.

In other words, in the timing analysis apparatus 3 according to the third embodiment, a first and second analysis conditions are generated in analysis condition generation processing performed by the analysis condition generation unit 11 using variation coefficients that are selected from a first and second variation coefficients. In the timing analysis apparatus 3, only one of an Early condition value and a Late condition value is selected in each of the first and second variation conditions, and written in the variation coefficient information F23.

In the variation coefficient information F23, a variation coefficient corresponding to each circuit cell includes either one of a variation coefficient of the Early condition and a variation coefficient of the Late condition. More specifically, the variation coefficient information F23 includes only variation coefficients of the Early condition for the low threshold cell LVT and the middle threshold cell MVT and only a variation coefficient of the Late condition for the high threshold cell HVT.

Setting these variation coefficients in this variation coefficient information F23 reflects high possibilities of occurrence of these variations in manufacturing processes. The variations that might be often generated in the manufacturing processes can be given by a statistic obtained from each manufacturing process or a statistic obtained from pre-evaluation activities. In addition, the variation coefficient information F23 can be set not on the basis of the maximum values of absolute variations of thresholds of respective circuit cells, but on the basis of the amounts of variations which might be often generated.

Subsequently, the analysis condition generation unit 11 of the timing analysis apparatus 3 according to the third embodiment generates three analysis condition tables on the basis of the variation coefficients defined in the variation coefficient information F23. More specifically, the timing analysis apparatus 3 generates the analysis condition tables F31, F33, and F36 in accordance with the variation coefficients written in the variation coefficient information F23. The analysis condition table F31 is generated by applying the variation coefficient of the Early condition to the variation width of the low threshold cell LVT (for example, the low threshold cell OCV table F11). The analysis condition table F33 is generated by applying the variation coefficient of the Early condition to the variation width of the middle threshold cell MVT (for example, the middle threshold cell OCV table F12). The analysis condition table F36 is generated by applying the variation coefficient of the Late condition to the variation width of the high threshold cell HVT (for example, the high threshold cell OCV table F13).

As describe above, in the timing analysis apparatus 3 according to the third embodiment, the analysis condition tables are generated using only the variation coefficients selected on the basis of the variations among the threshold voltages of circuit cells that might be often generated in the manufacturing process. Therefore, in the timing analysis apparatus 3, while the number of timing analysis processes performed in the timing analysis unit 12 is reduced, the analyses regarding the variation patterns that bring about a big problem in the manufacturing process are performed, and the number of defects generated in the manufacturing process can be effectively reduced.

Figure 19:
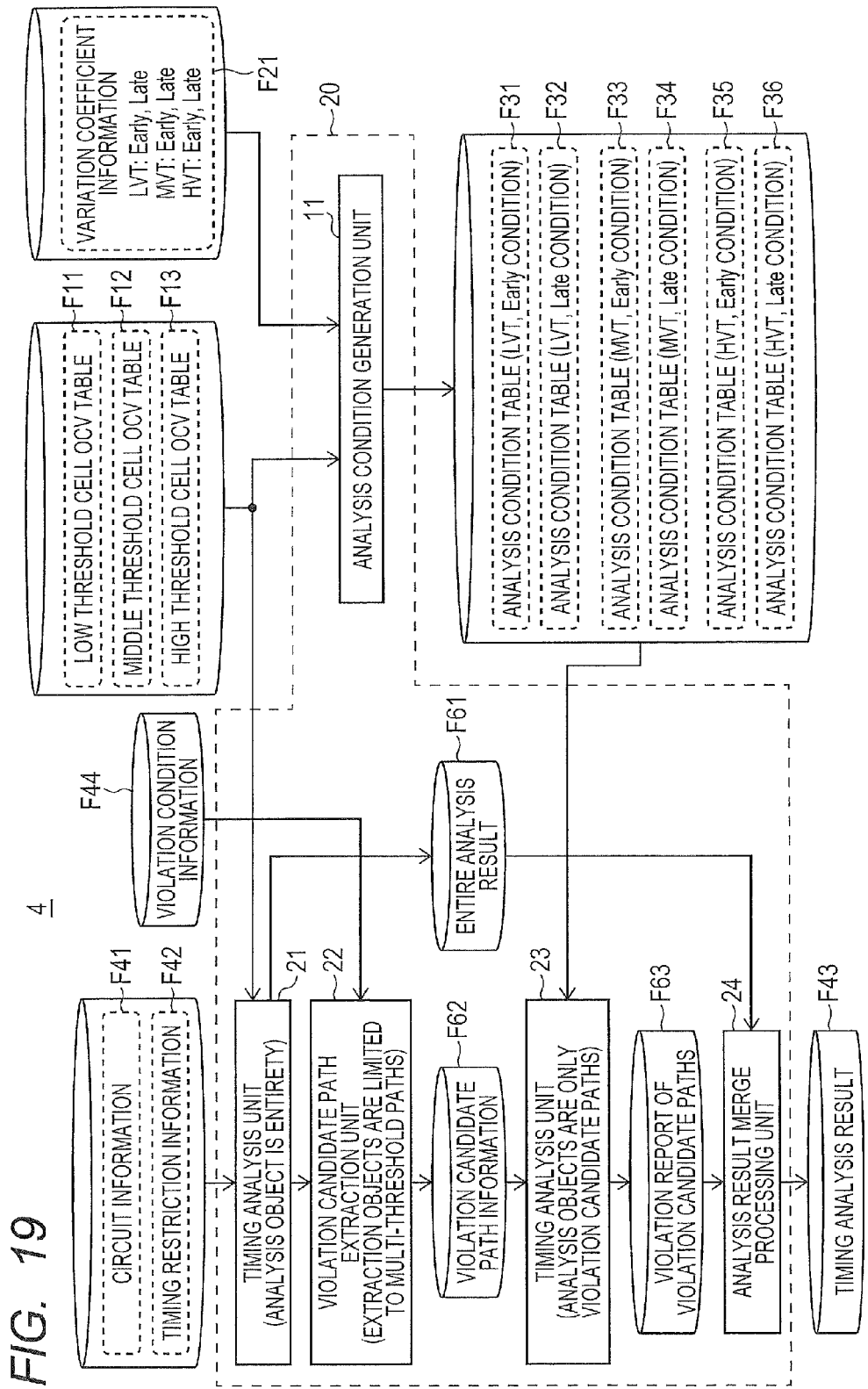
FIG. 19 is a block diagram of a timing analysis apparatus according to a fourth embodiment.

In addition, in the above description, the variation coefficients to be selected are determined on the basis of variations that are often generated among the variations among the threshold voltages of the circuit cells generated in the manufacturing process. However, in the manufacturing process of semiconductor integrated circuits, there is a case where parameters of the manufacturing process are managed in accordance with a characteristic to which priority is given among various characteristics such as the operation speed and power consumption. In such a case, it is possible that the variations among threshold voltages of the circuit cells that might be often generated are predicted to some extent. Therefore, it becomes possible that variation coefficients to be selected are determined on the basis of the variations among the threshold voltages of circuit cells that can be obtained from the intended manufacturing parameters Fourth Embodiment In a fourth embodiment, another example of procedures of timing analysis processing will be described. FIG. 19 is a block diagram of a timing analysis apparatus 4 according to the fourth embodiment. As shown in FIG. 19, the timing analysis apparatus 4 includes a computing unit 20 instead of the computing unit 10 of the timing analysis apparatus 1.

This computing unit 20 reads out a timing analysis program from a memory unit (not shown), and materializes various processing functions of the timing analysis apparatus 4 by executing this program. An example shown in FIG. 19 is a block diagram showing the various functions materialized in the computing unit 20. As shown in FIG. 19, the computing unit includes the analysis condition generation unit 11, a timing analysis unit 21, a violation candidate path extraction unit 22, a timing analysis unit 23, and an analysis result merge processing unit 24. In addition, as shown in FIG. 19, the computing unit 20 generates an entire analysis result F61, a violation candidate path information F62, and a violation report F63 of violation candidate paths in the forms of intermediate files. In the following description, components of the timing analysis apparatus 4 that are the same as those of the timing analysis apparatus 1 are given the same reference numerals, and their redundant explanation will be omitted.

The timing analysis unit 21 performs a first timing analysis by applying predefined parameters (for example, the low threshold cell OCV table F11, the middle threshold cell OCV table F12, and the high threshold cell OCV table F13) to the entirety of a design circuit described in the circuit information F41. More specifically, the timing analysis unit 21 performs a first timing analysis regarding a circuit shown by the circuit information F41 by taking in the circuit information F41, the timing restriction information F42, the low threshold cell OCV table F11, the middle threshold cell OCV table F12, and the high threshold cell OCV table F13. In this case, the timing analysis unit 21 performs the timing analysis on the entirety of the circuit given by the circuit information F41. Subsequently, the timing analysis unit 21 outputs the analysis result regarding the entirety of the circuit (for example, the entire analysis result F61).

With reference to a given violation condition information F44, the violation candidate path extraction unit 22 extracts violation candidate paths whose timing margins are smaller than a standard value provided by the violation condition information F44 on the basis of the analysis result. Subsequently, the violation candidate path extraction unit 22 outputs the extraction result as the violation candidate path information F62. In addition, a path that can be an object of extraction by the violation candidate path extraction unit 22 is limited to a multi-threshold path on which there are plural circuit cells whose threshold voltages are different from each other.

The timing analysis unit 23 performs a second timing analysis on the violation candidate paths using the first and second analysis conditions (for example, using the analysis condition tables F31 to F36). In other words, the timing analysis unit 23 performs a timing analysis only on the violation candidate paths in consideration of the variations among the threshold voltages of circuit cells. Subsequently, the timing analysis unit 23 outputs the violation report F63 of the analyzed violation candidate paths. In addition, the timing analysis unit 21 and the timing analysis unit 23 are different only in that they have different paths as analysis objects and they have different pieces of input delay information (for example, different OCV tables), but they perform the same timing analysis on their analysis object paths respectively. Therefore, the timing analysis unit 21 and the timing analysis unit 23 can be implemented as the same processing unit.

The analysis result merge processing unit 24 merges the analysis result shown by the violation report F63 of the violate candidate paths and the entire analysis result F61 and outputs the timing analysis result F43.

As described above, the timing analysis apparatus 4 performs a timing analysis on the entirety of an analysis object circuit using OCV tables in which the variations among circuit cells are not considered, and extracts violation candidate paths with a small margin. Subsequently, the timing analysis unit 4 performs a timing analysis more than once only on the violation candidate paths in consideration of the variations among the circuit cells. As a result, in the timing analysis apparatus 4, the number of paths on which the detailed timing analysis is performed is reduced, and the total analysis time can be shortened.

Fifth Embodiment

In the above-described embodiments, the analysis conditions that shifts the variation widths of delays on the basis of the relative variations among the circuit cells by applying variation coefficients to the OCV tables that define the variation widths of delays set for circuit cells. Here, the delay values set for the circuit cells are values to be criteria for the variation widths defined by the OCV tables. In the fifth embodiment, an embodiment will be described where analysis conditions, in which delay values set for the circuit cells are shifted on the basis of variation coefficients that define the relative variations among the circuit cells, are generated. By performing a timing analysis using analysis conditions that are generated by a timing analysis apparatus 5 according to the fifth embodiment, the timing analysis can be performed that are the same as those performed in the above-described embodiments where analysis conditions, under which the variation widths of delays are shifted on the basis of variation coefficients, are generated.

Figure 20:
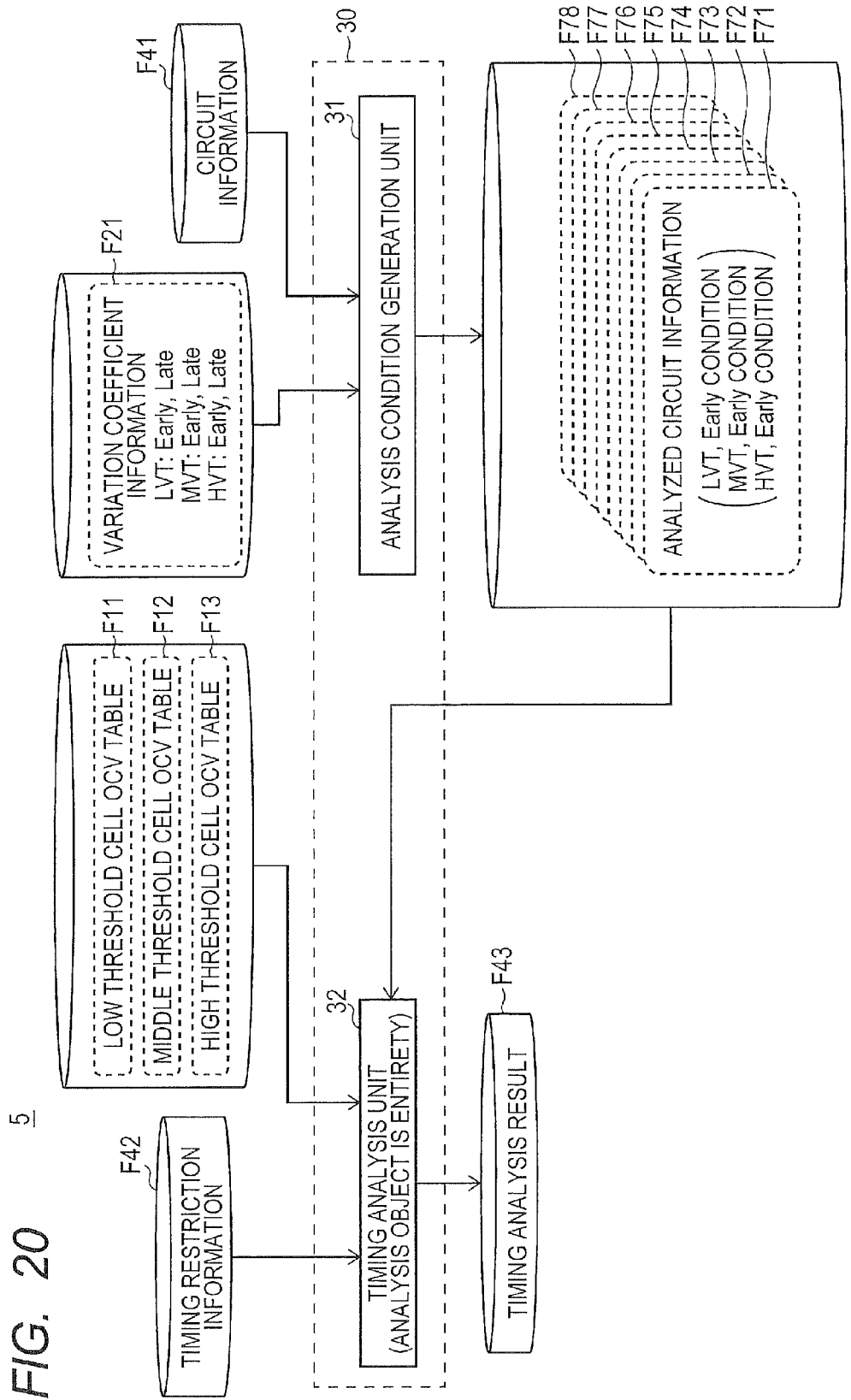
FIG. 20 is a block diagram of a timing analysis apparatus according to a fifth embodiment.

A block diagram of the timing analysis apparatus 5 according to the fifth embodiment is shown in FIG. 20. As shown in FIG. 20, the timing analysis apparatus 5 includes a computing unit 30. The computing unit 30 includes an analysis condition generation unit 31 and a timing analysis unit 32. The computing unit 30 reads out a timing analysis program from a memory (not shown), and materializes the functions of the analysis condition generation unit 31 and the timing analysis unit 32 by executing the program.

The analysis condition generation unit 31 reads out the circuit information F41 and the variation coefficient information F21 from the memory, and generates pieces of analysis circuit information F71 to F78 as analysis conditions. The circuit information F41 includes delay information that defines a first delay value that is set for a first circuit cell and a second delay value that is set for a second circuit cell. This delay information is given, for example, in the form of an SDF (Standard Delay File). The timing analysis unit 32 performs the timing analysis using the first and second delay values as standard values of the first and second variation widths that show the variation widths of a first and a second delay values given by the OCV tables.

The analysis condition generation unit 31 generates a first analysis condition that includes a first delay variation value that is the first delay value shifted on the basis of a first variation coefficient and a second analysis condition that includes a second delay variation value that is the second delay value shifted on the basis of a second variation coefficient.

More specifically, the analysis condition generation unit extracts information regarding circuit cells from the circuit information F41, and respectively classifies the extracted circuit cells into any of the low threshold cell LVT, the middle threshold cell MVT, and the high threshold cell HVT. Subsequently, the analysis condition generation unit 31 reads out a variation coefficient of the Early condition and a variation coefficient of the Late condition for each circuit cell from the variation coefficient information F21, and generates eight types of analysis circuit information F71 to F78 that have different combinations of the Early condition and the Late condition for each of the three types of the circuit cells.

The analysis circuit information F71 includes delay variation values that are generated by shifting the delay values of the low threshold cell LVT, the middle threshold cell MVT, and the high threshold cell HVT respectively on the basis of the Early condition values of the corresponding circuit cells. The analysis circuit information F72 includes delay variation values that are generated by shifting the delay values of the middle threshold cell MVT and the high threshold cell HVT respectively on the basis of the Early condition values of the corresponding circuit cells and a delay variation value that is generated by shifting the delay value of the low threshold cell LVT on the basis of the Late condition value of the low threshold cell LVT. The analysis circuit information F73 includes delay variation values that are generated by shifting the delay values of the low threshold cell LVT and the high threshold cell HVT respectively on the basis of the Early condition values of the corresponding circuit cells and a delay variation value that is generated by shifting the delay value of the low threshold cell MVT on the basis of the Late condition value of the middle threshold cell MVT. The analysis circuit information F74 includes a delay variation value that is generated by shifting the delay value of the high threshold cell HVT on the basis of the Early condition value of the high threshold cell HVT and delay variation values that are generated by shifting the delay values of the low threshold cell LVT and the middle threshold cell MVT respectively on the basis of the Late condition values of the corresponding circuit cells.

The analysis circuit information F74 includes a delay variation value that is generated by shifting the delay value of the high threshold cell HVT on the basis of the Late condition value of the high threshold cell HVT and delay variation values that are generated by shifting the delay values of the low threshold cell LVT and the middle threshold cell MVT respectively on the basis of the Early condition values of the corresponding circuit cells. The analysis circuit information F76 includes delay variation values that are generated by shifting the delay values of the low threshold cell LVT and the high threshold cell HVT respectively on the basis of the Late condition values of the corresponding circuit cells and a delay variation value that is generated by shifting the delay value of the middle threshold cell MVT on the basis of the Early condition value of the middle threshold cell MVT. The analysis circuit information F77 includes delay variation values that are generated by shifting the delay values of the middle threshold cell MVT and the high threshold cell HVT respectively on the basis of the Late condition values of the corresponding circuit cells and a delay variation value that is generated by shifting the delay value of the low threshold cell LVT on the basis of the Early condition value of the low threshold cell LVT. The analysis circuit information F78 includes delay variation values that are generated by shifting the delay values of the low threshold cell LVT, the middle threshold cell MVT, and the high threshold cell HVT respectively on the basis of the Late condition values of the corresponding circuit cells.

Hereinafter, the delay information included in the circuit information F41 and the delay information included in the analysis circuit information F71 to F78 will be described in detail. FIG. 21 is a schematic view of the delay information included in circuit information F41 which is input to the timing analysis apparatus 5 according to the fifth embodiment. The delay information shown in FIG. 21 is information including delay values defined in the SDF format. In an example shown FIG. 21, CELL_1 is written as the name of a circuit cell. In addition, in the example of FIG. 21, a rise time showing a time period from the time when a signal is input into an input terminal to the time when the signal appears at the corresponding output terminal, and a fall time showing a time period from the time when inputting the signal into the input terminal is stopped to the time when the signal disappears at the output terminal are defined for each of combinations of input terminals and the corresponding output terminals of the circuit CELL_1.

More specifically, in this delay information, the minimum value of the rise time rise_min and the maximum value of the rise time rise_max, and the minimum value of the fall time fall_min and the maximum value of the fall time fall_max are written in the SDF format. In an example shown in FIG. 21, the minimum value of the rise time rise_min between the input terminal A and the output terminal YB is 0.050. The maximum value of the rise time rise_max between the input terminal A and the output terminal YB is 0.052. The minimum value of the fall time fall_min between the input terminal A and the output terminal YB is 0.050. The maximum value of the fall time fall_max between the input terminal A and the output terminal YB is 0.052. Because the circuit cell CELL_1 includes input terminals A, B, and C, and the output terminal YB, three delay values are written in accordance with the number of the input terminals. In addition, in the example shown in FIG. 21, typical values of the rise times and typical values of the fall times are not written because they are not used for a timing analysis in which variations are taken into consideration.

Next, FIG. 22 is a schematic view showing the delay information included in the analysis circuit information F73 generated as an analysis condition in the timing analysis apparatus 5 according to the fifth embodiment. Here, although the pieces of delay information included in the analysis circuit information F71 to F78 have the values of delay variations different from each other, these values are written in the same format, therefore these pieces of delay information will be described by describing the delay information included in the analysis circuit information F73 on behalf of these pieces of delay information.

Values regarding the delay information shown in FIG. 22 are obtained by multiplying the corresponding values regarding the delay information shown in FIG. 21 by the variation coefficient of the Early condition for the middle threshold cell (for example, the corresponding value shown in FIG. 3). To put it concretely, the delay information included in the analysis information F73 includes values obtained by multiplying the delay values shown in FIG. 21 as the delay variation values by the variation coefficient of the Early condition for the middle threshold cell, that is, 0.946.

The timing analysis unit 32 reads out the above-described pieces of analysis circuit information F71 to F78 in sequence, and performs a timing analysis by applying the low threshold cell OCV table F11, the middle threshold cell OCV table F12, and high threshold cell OCV table F13 to each piece of analysis circuit information. In this timing analysis, because the delay variation values included in analysis circuit information F71 to F78 have already included shift components owing to the variation coefficients, results, which are the same as those obtained in the timing analysis apparatus 1 according to the first embodiment, can be obtained by applying the OCV tables that are prepared in advance to these pieces of analysis circuit information.

As described above, in the fifth embodiment, the analysis conditions are generated by shifting the delay values included in circuit information on the basis of the variation coefficient information. In this way, it is also possible to obtain the result of the timing analysis that is the same as the result obtained in the first embodiment by including the variation coefficients in the circuit information. In other words, the timing analysis apparatus 5 described in the fifth embodiment shows an example of a timing analysis apparatus that can also obtain the same result as those obtained in the first embodiment by generating analysis conditions even through the procedure different from those used in the timing analysis apparatus 1 according to the first embodiment.

Although the present invention achieved by the inventors have been concretely described so far on the basis of some embodiments, it goes without saying that the present invention is not limited by any of the details of the above-described embodiments, and that various modifications may be made without departing from the spirit and scope of the present invention.

What is claimed is:

1. A timing analysis program stored in a non-transitory computer readable medium, which is executed in a computing device, for causing the computing device to perform a timing analysis on a design circuit including a first circuit cell having a first delay value and a second circuit cell having a second delay value different from the first delay value, the timing analysis program comprising:
- a means for reading out variation range information that defines the variation width of the first delay value of the first circuit cell and the variation width of the second delay value of the second circuit cell from a memory unit;
- a means for reading out variation coefficient information that includes a first variation coefficient that shows the shift degree of the variation width of the first delay value and a second variation coefficient that shows the shift degree of the variation width of the second delay value from the memory unit; and
- a means for performing analysis condition generation processing which generates a first analysis condition in which the variation width of the first delay value is shifted on the basis of the first variation coefficient and a second analysis condition in which the variation width of the second delay value is shifted on the basis of the second variation coefficient.

2. The timing analysis program according to claim 1, wherein the first variation coefficient includes an Early condition that is a condition under which the first delay value shifts to a smaller value and a Late condition that is a condition under which the first delay value shifts to a larger value, and
- wherein the second variation coefficient includes an Early condition that is a condition under which the second delay value shifts to a smaller value and a Late condition that is a condition under which the second delay value shifts to a larger value.

3. The timing analysis program according to claim 1, wherein one of the first and second variation coefficients includes a coefficient that makes the shift degree of the variation width of the delay value zero, and
- wherein the other of the first and second variation coefficients includes coefficients that show the shift degree of the variation width of the first delay value and the shift degree of the variation width of the second delay value.

4. The timing analysis program according to claim 1, wherein, in the analysis condition generation processing, the first and second analysis conditions are generated using variation coefficients selected from the first and second variation coefficients.

5. The timing analysis program according to claim 1, wherein the first and second delay values defined by the OCV (On Chip Variation) tables form table information with variation amounts of signal delay times on the basis of distances between both ends of paths and the numbers of circuit cell stages in the paths.

6. The timing analysis program according to claim 1, wherein the timing analysis is performed on the design circuit using the first analysis condition and the second analysis condition.

7. The timing analysis program according to claim 6, wherein, in the timing analysis,
- a first timing analysis is performed on the entirety of the design circuit to which predefined parameters are applied,
- a violation candidate path having a timing margin smaller than a predetermined standard value is extracted on the basis of the analysis result of the first timing analysis, and
- a second timing analysis is performed on the violation candidate path using the first and second analysis conditions.

8. The timing analysis program according to claim 7, wherein, the violation candidate path is extracted from paths in which plural circuit cells having different threshold voltages are included.

9. The timing analysis program according to claim 7, wherein a violation report is generated on the basis of the second timing analysis, and
- wherein a timing analysis result is generated by merging the violation report, the analysis result of the first timing analysis, and the information of the violation report.

10. The timing analysis program according to claim 1, wherein the first delay value is a value serving as a standard value for the variation width of the first delay value, and the first analysis condition includes a first delay variation value which is the first delay value shifted on the basis of the first variation coefficient, and
- wherein the second delay value is a value serving as a standard value for the variation width of the second delay value, and the second analysis condition includes a second delay variation value which is the second delay value shifted on the basis of the second variation coefficient.

11. A timing analysis method for causing a computing device to perform a timing analysis on a design circuit including a first circuit cell having a first delay value and a second circuit cell having a second delay value different from the first delay value, the timing analysis method comprising:
- a function for reading, by a computer, out variation range information that defines the variation width of the first delay value of the first circuit cell and the variation width of the second delay value of the second circuit cell from a memory unit;
- a function for reading out variation coefficient information that includes a first variation coefficient that shows the shift degree of the variation width of the first delay value and a second variation coefficient that shows the shift degree of the variation width of the second delay value from the memory unit; and
- a function for performing analysis condition generation processing which generates a first analysis condition in which the variation width of the first delay value is shifted on the basis of the first variation coefficient and a second analysis condition in which the variation width of the second delay value is shifted on the basis of the second variation coefficient.

12. The timing analysis method according to claim 11, wherein the first variation coefficient includes an Early condition that is a condition under which the first delay value shifts to a smaller value and a Late condition that is a condition under which the first delay value shifts to a larger value, and
- wherein the second variation coefficient includes an Early condition that is a condition under which the second delay value shifts to a smaller value and a Late condition that is a condition under which the second delay value shifts to a larger value and.

13. The timing analysis method according to claim 11, wherein one of the first and second variation coefficients includes a coefficient that makes the shift degree of the delay value zero, and wherein the other of the first and second variation coefficients includes coefficients that show the shift degree of the variation width of the first delay value and the shift degree of the variation width of the second delay value.

14. The timing analysis method according to claim 11, wherein, in the analysis condition generation processing, the first and second analysis conditions are generated using variation coefficients selected from the first and second variation coefficients.

15. The timing analysis method according to claim 11, wherein the first and second delay values defined by the OCV (On Chip Variation) tables form table information with variation amounts of signal delay times on the basis of distances between both ends of paths and the numbers of circuit cell stages in the paths.

16. The timing analysis method according to claim 11, wherein the timing analysis program is performed on the design circuit using the first analysis condition and the second analysis condition.

17. The timing analysis method according to claim 16, wherein, in the timing analysis,
 a first timing analysis is performed on the entirety of the design circuit to which predefined parameters are applied,
 a violation candidate path having a timing margin smaller than a predetermined standard value is extracted on the basis of the analysis result of the first timing analysis, and
 a second timing analysis is performed on the violation candidate path using the first and second analysis conditions.

18. The timing analysis method according to claim 11, wherein the first delay value is a value serving as a standard value for the variation width of the first delay value, and the first analysis condition includes a first delay variation value which is the first delay value shifted on the basis of the first variation coefficient, and
 wherein the second delay value is a value serving as a standard value for the variation width of the second delay value, and the second analysis condition includes a second delay variation value which is the second delay value shifted on the basis of the second variation coefficient.

19. A timing analysis method for causing a computing device to perform a timing analysis on a design circuit including a first circuit cell having a first delay value and a second circuit cell having a second delay value different from the first delay value, the timing analysis method comprising:
 causing the computing device to read out variation range information that defines the variation width of the first delay value of the first circuit cell and the variation width of the second delay value of the second circuit cell from a memory unit;
 causing the computing device to read out variation coefficient information that includes a first variation coefficient that shows the shift degree of the variation width of the first delay value and a second variation coefficient that shows the shift degree of the variation width of the second delay value from the memory unit; and
 causing the computing device to perform analysis condition generation processing which generates a first analysis condition in which the variation width of the first delay value is shifted on the basis of the first variation coefficient and a second analysis condition in which the variation width of the second delay value is shifted on the basis of the second variation coefficient.

20. The timing analysis method according to claim 19, further comprising: performing timing analysis on the design circuit using the first analysis condition and the second analysis condition.

* * * * *